(12) United States Patent  
Sampath et al.

(10) Patent No.: US 7,812,366 B1  
(45) Date of Patent: Oct. 12, 2010

(54) ULTRAVIOLET LIGHT EMITTING ALGAN COMPOSITION, AND ULTRAVIOLET LIGHT EMITTING DEVICE CONTAINING SAME

(75) Inventors: Anand Venktesh Sampath, Chevy Chase, MD (US); Charles J. Collins, Austin, TX (US); Gregory Alan Garrett, Kensington, MD (US); H. Paul Shen, Potomac, MD (US); Michael Wraback, Germantown, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 678 days.

(21) Appl. No.: 11/376,453

(22) Filed: Mar. 15, 2006

Related U.S. Application Data

(60) Provisional application No. 60/663,144, filed on Mar. 18, 2005.

(51) Int. Cl.
*H01L 21/28* (2006.01)

(52) U.S. Cl. ............................ 257/103; 257/79; 257/94; 257/97; 257/200; 257/201; 257/E21.108; 257/E21.112; 257/E21.113

(58) Field of Classification Search .................. 257/76, 257/79, 94, 97–98, 103, 200–201
See application file for complete search history.

(56) References Cited

U.S. PATENT DOCUMENTS

| | | | |
|---|---|---|---|
| 6,888,170 B2 | 5/2005 | Schaff et al. | |
| 2004/0232438 A1* | 11/2004 | Ogawa | 257/103 |
| 2006/0118820 A1* | 6/2006 | Gaska et al. | 257/189 |
| 2006/0278880 A1* | 12/2006 | Lee et al. | 257/79 |

OTHER PUBLICATIONS

Mayes et al. "High-power 280 nm AlGaN light-emitting diodes based on an asymmetric single-quantum well", Applied Phys. Letters, vol. 84, No. 26, Feb. 2004, pp. 4910-4912.*

Garrett et al. "Defect density dependence of carrier dynamics in AlGaN multiple quantum wells grown on GaN substrates . . . " Phys. Stat. Sol(c) vol. 2, No. 7 p. 2332-2336 (2005).

Klausing et al. "Improved quality of plasma assisted MBE-grown GaN/AlGaN quantum wells revealed by two-wavelength excited . . . " Phys. Stat. Sol. (c) 0, No. 7 p. 2658-2661 (2003).

Klausing et al. "Electron Beam Pumped Nitride Vertical Cavity Surface Emitting Structures with AlGaN/AlN DBR Mirrors" Phys. Stat. Sol. (a) 0, No. 2, p. 428-432 (2002).

(Continued)

*Primary Examiner*—A. Sefer
(74) *Attorney, Agent, or Firm*—Stephen M. Bloor; Richard A. Morgan; Christos S. Kyriakou

(57) ABSTRACT

An AlGaN composition is provided comprising a group III-Nitride active region layer, for use in an active region of a UV light emitting device, wherein light-generation occurs through radiative recombination of carriers in nanometer scale size, compositionally inhomogeneous regions having band-gap energy less than the surrounding material. Further, a semiconductor UV light emitting device having an active region layer comprised of the AlGaN composition above is provided, as well as a method of producing the AlGaN composition and semiconductor UV light emitting device, involving molecular beam epitaxy.

26 Claims, 27 Drawing Sheets

OTHER PUBLICATIONS

Fedler et al. "Strain, morphological, and growth mode changes in AlGaN single layers at high AlN mole fraction" Jun. 2002, J. of Crystal Growth, vol. 241, issue 4, pp. 535-542.

Kobayashi et al. "In-situ optical monitoring of surface morphology and stoichiomety during GaN metal organic vapor . . . " Jun. 2000, Appl. Surf. Sci., vol. 159-160, pp. 398-404.

Kuek et al. "Effects of Band Tail Absorption on AlGaN-Based Ultraviolet Photodiodes" Nov. 22, 2001, Physica status solidi (a), vol. 188, issue 1, pp. 311-315.

Battacharyaa et al. "High reflectivity and crack-free AlGaN/AlN ultraviolet distributed Bragg . . . " May/Jun. 2002, Jour. of Vac. Sci. & Tech. B, vol. 20 issue 3, pp. 1229-1233.

Bhattacharyya et al. "Efficient p-type doping of GaN films by plasma-assisted molecular beam epitaxy" Appl. Phys. Lett. 85, 4956 (2004).

Heying et al. "Optimization of the surface morpoholgies and electron mobilites in GaN grown by plasma-assisted MBE" Appl. Phys. Lett. 77, 2885_2000.

Elsass et al. "Influence of GA flux on the growth and electron transport properties of AlGaN/GaN . . . " J. Cryst. Growth, 233, (2001) 709.

Elsass et al. "Effects of growth condtions on the incorporation of oxygen in ALGaN layers grown by plasma assisted MBE" Appl. Phys. Lett. 77, 3167_2000.

Hierro et al. "Impact of GA/N flux ratio on trap states in n-GaN grown by plasma-assited molecular-beam epitaxy" Appl. Phys. Lett, 80, (2002) 805.

Moustakas et al. "Gallium Nitride II (GaN II)"Semiconductors and Semimetals, vol. 57 (eds. J.I Pankove and T.D. Moustakas) Academic Press, San Diego, 1999.

Sampath et al. "Effect of Ga-rich growth conditions on the optical properties of GaN films grown by plasma assisted MBE" J. Vac. Sci. Technol. B 22(3) May/Jun. 2004.

Kim et al. "Time-resolved photoluminescence studies of $Al_xGa_{1-x}N$ alloys" Appl. Phys. Lett. 76, 1252 (2000).

Heying et al. "Control of GaN surface morphologies using plasma-assisted molecular beam epitaxy" Journal of Applied Physics, 88, 1855 (2000).

Wraback et al. "Time-Resolved Studies of Carrier Dynamics as a Function of Al content in AlGaN Alloys" Phys. Status Sol. 188, 807 (2001).

Huang et al. "Dependence of GAN polarity on the parameters of the buffer layer grown by molecular beam epitaxy" Jun. 25, 2001, Appl. Phys. Letters, vol. 78, No. 26, pp. 4145-4147.

Wieczorek et al. Analysis of optical emission from high-aluminum AlGaN quantum-well structures. May 25, 2004.

Crawford et al. Optimization and performance of AlGaN-based multi-quantum well deep UV LEDs. 2004.

Chitnis et al. Self-heating effects at high pump currents in deep ultraviolet light-emitting diodes at 325 nm. Oct. 28, 2002.

Adivarahan et al. High-efficiency 269 nm emission deep ultraviolet light-emitting diodes. Jun. 7, 2004.

Adivarahan et al. 250 nm AlGaN light-emitting diodes. Sep. 20, 2004.

Waltereit et al. Blue GaN-based light-emitting diodes grown by molecular-beam epitaxy with external quantum efficiency greater than 1.5%. Apr. 12, 2004.

Nakamura et al. High-power InGaN single-quantum-well-structure blue and violet light-emitting diodes. Sep. 25, 1995.

Nakamura. InGaN/AlGaN blue-light-emitting diodes. May/Jun. 1995.

Nakamura et al. High-brightness InGaN/AlGaN double-heterostructure blue-green-light-emitting diodes. Dec. 15, 1994.

Chichibu et al., Luminescences from localized states in InGaN epilayers. May 26, 1997.

Chichibu et al. Spatially resolved cathodoluminescence spectra InGaN quantum wells. Oct. 20, 1997.

Sun et al. Carrier dynamics of high-efficiency green light emission in graded-indium-content InGaN/GaN quantum wells:An Important role of effective carrier . . . Jan. 5, 2004.

Monroy et al. Molecular-beam epitaxial growth and characterization of quaternary III-nitride compounds. Sep. 1, 2003.

Ryu et al. Luminescence mechanisms in quaternary $Al_xIn_yGa_{1-x-y}N$ materials. May 20, 2002.

Hirayama et al. Marked enhancement of 320-360 nm ultraviolet emission in quaternary $In_xAl_yGa_{1-x-y}N$ with In-segregation effect. Jan. 14, 2002.

Chen et al. Mechanism of enhanced luminescence in $In_xAl_yGa_{1-x-y}N$ quaternary epilayers. Mar. 1, 2004.

Cho et al. Dynamics of anomalous optical transitions in $Al_xGa_{1-x}N$ alloys. Mar. 15, 2000.

Bell et al. Exciton freeze-out and thermally activated relaxation at local potential fluctuations in thick $Al_xGa_{1-x}N$ layers. May 1, 2004.

Shaw et al. Field Testing and Evaluation of a Solar Blind UV Communications Link for Unattended Ground Sensors. 2004.

Radkov et al. White Light with UV LEDs. 2004.

Katona et al. Growth and Fabrication of Short Wavelength UV LEDs. 2004.

Khan. III-N Multiple Quantum Wells Based 280-340 nm Deep Ultraviolet Light Emitting Diodes over Sapphire. 2003.

Nam et al. Unique optical properties of AlGaN alloys and related ultraviolet emitters. Jun. 10, 2004.

Matsuoka. Calculation of unstable mixing region in wurtzite $In_{1-x-y}Ga_xAl_yN$. Jul. 7, 1997.

Borisov et al. Enhanced deep ultraviolet luminescence from AlGaN quantum wells grown in the three-dimensional mode. Oct. 31, 2005.

Collins et al. Intense, Long-Lived Room Temperature Photoluminescence from Localized States in AlGaN Alloys. Dec. 2004.

Collins et al. Enhanced room-temperature luminescence efficiency through carrier localization in $Al_xGa_{1-x}N$ Alloys. Jan. 14, 2005.

Collins et al. Double Heterostructure UV LEDs Based on Carrier Localization in MBE-Grown AlGaN. Jun. 2005.

Collins et al. UVLED Based on Carrier Localization in AlGaN. May 2005.

Collins et al. UVLED based on carrier localization in AlGaN. May 23, 2005.

Garrett et al. AlGaN active regions exhibiting enhanced emission from nanoscale compositional inhomogeneities: . . . Aug. 2005.

Sampath et al. Growth of AlGaN Alloys Exhibiting Enhanced Luminescence Efficiency. Jun. 2005.

Sampath et al. Double Heterostructure UV-LEDs based on Nanoscale Compositional Inhomogeneity (NCI) in AlGaN Alloys. Jul. 2005.

Sampath et al. Novel AlGaN Active Regions for the Development of III-Nitride Based UV-Emitters. Sep. 16, 2005.

Wraback et al. "Make Light, not Heat": Toward Higher Efficiency Semiconductor Ultraviolet Optical Sources. Oct. 2004.

Wraback et al. Make light, not heat: toward higher efficiency nitride semiconductor ultraviolet optical sources. 2004.

Wraback et al. High Efficiency Light Emission Through Carrier Localization in AlGaN Alloys and Active Regions:Toward Viable Ultraviolet Light Sources . . . Nov. 2004.

Wraback et al. High Efficiency Light Emission Through Carrier Localization in AlGaN Alloys and Active Regions: . . . 2004.

* cited by examiner

ULTRAVIOLET LIGHT EMITTING ALGAN COMPOSITION, AND ULTRAVIOLET LIGHT EMITTING DEVICE CONTAINING SAME

This application claims the priority of the corresponding provisional application Ser. No. 60/663,144, filed Mar. 18, 2005, the entire contents of which are incorporated herein by reference. This application is related to application Ser. No. 11/376,452 filed on even date for a Method of Manufacturing An Ultraviolet Light Emitting AlGaN Composition And Ultraviolet Light Emitting Device Containing Same.

STATEMENT OF GOVERNMENT INTEREST

The invention described herein may be manufactured and used by or for the Government of the United States of America for governmental purposes without the payment of any royalties thereon or therefor.

FIELD OF THE INVENTION

The present invention provides an ultraviolet (UV) light emitting AlGaN composition, a UV light emitting device, and a method of making both. In particular, a UV light emitting device is provided comprised of an active region layer composed of AlGaN having localized nanoscale compositional inhomogeneities therein, as well as a manufacturing method for producing such an UV light emitting device.

BACKGROUND OF THE INVENTION

Conventionally, blue/violet LED's have been made using InGaN alloys to produce the layers thereof. Problems encountered when fabricating optical sources using high dislocation density III-Nitride materials, such as InGaN alloys, was first addressed during the development of LED's using the $In_xGa_{1-x}N$ alloy system. It was found that the material properties of InGaN alloys change as the amount of indium in the alloy is increased. With the proper growth conditions, however, it was discovered that material could be grown in which the indium did not incorporate uniformly throughout the InGaN layer (i.e., the material has areas of high and low concentrations of indium spread throughout). These compositional fluctuations, also known as localized inhomogeneities, result in carrier localization and lead to an enhancement in the radiative efficiency despite the high dislocation density.

The discovery of the effects of the localized inhomogeneities enabled the development of commercially successful blue InGaN-based LEDs and laser diodes (LDs). See P. Waltereit, H. Sato, C. Poblenz, D. S. Green, J. S. Brown, M. Mclaurin, T. Katona, S. P. DenBaars, J. S. Speck, J. H. Liang, M. Kato, H. Tamura, S. Omori, and C. Funaoka, *Appl. Phys. Lett.* 84, 2748 (2004); S, Nakamura, M. Senoh, N. Iwasa, and S. Nagahama, *Appl. Phys. Lett.* 67, 1868 (1995); S, Nakamura, *J. Vac. Sci. Technol. A* 13, 705 (1995); S. Nakamura, T. Mukai, M. Senoh, *J. Appl. Phys.* 76, 8189, (1994), each of which are incorporated herein by reference in their entireties.

Specifically, it has been reported that the intense red-shifted photoluminescence (PL) peaks observed in InGaN alloys at room temperature result from the recombination of excitons localized at potential minima originating from large compositional fluctuations. See S. Chichibu, T. Azuhata, T. Sota, and S. Nakamura, *Appl. Phys. Lett.* 70, 2822 (1997); S. Chichibu, K. Wada, and S. Nakamura, *Appl. Phys. Lett.* 71, 2346 (1997); Y. Sun, Y. Cho, E. K. Suh, H. J. Lee, R. J. Choi, and Y. B. Hahn, *Appl. Phys. Lett.* 84, 49 (2004), each of which are incorporated herein by reference in their entireties. Unfortunately, InGaN alloys are not suitable for use in UV LED's at wavelengths shorter than 365 nanometers (nm).

A similar localization effect resulting from the creation of localized inhomogeneities has been reported for quaternary InAlGaN alloys having an InN mole fraction of up to 20% and an AlN mole fraction of up to 60%, corresponding to light emission at wavelengths shorter than 365 nm. See E. Monroy, N. Gogneau, F. Enjalbert, F. Fossard, D. Jalabert, E. Bellet-Amalric, Le Si Dang, and B. Daudin, *J. Appl. Phys.* 94, 3121 (2003); Mee-Yi Ryu, C. Q. Chen, E. Kuokstis, J. W. Yang, G. Simin, and M. Asif Khan, *Appl. Phys. Lett.* 80, 3730 (2002); H. Hirayama, A. Kinoshita, T. Yamabi, Y. Enomoto, A. Hirata, T. Araki, Y. Nanishi, and Y. Aoyagi, *Appl. Phys. Lett.* 80, 207 (2002); C. H. Chen, Y. F. Chen, Z. H. Lan, L. C. Chen, K. H. Chen, H. X. Jiang, and J. Y. Lin, *Appl. Phys. Lett.* 84, 1480 (2004), each of which are incorporated herein by reference in their entireties. The carrier localization observed in such InAlGaN quaternary materials is also attributed to indium segregation therein, resulting in enhanced luminescence at a peak wavelength significantly red-shifted (150 to 300 meV) with respect to the band edge.

The use of aluminum gallium nitride ($Al_xGa_{1-x}N$), as opposed to InAlGaN, is preferred as the base material for manufacturing UV LED devices due to the difficulty in growing device quality quaternary material (InAlGaN). AlGaN has, therefore, become the most important material for use in the development of ultraviolet semiconductor optical sources operating at wavelengths between 260 to 360 nm due to its tunable bandgap from 3.4 eV to 6.2 eV. Such sources have many useful military and commercial applications, including water purification, phosphor based white light sources, high-density data storage, bioagent detection and non-line of sight (NLOS) covert communication. See G. A. Shaw, A. M. Siegel, J. Model, and N. Nischan, *SPIE Defense & Security Symposium*, Vol. 5417, (2004), and E. Radkov, R. Bompiedi, A. M. Srivastava, A. A. Setlur, and C. A. Becket, *Proc. SPIE Int. Soc. Opt. Eng.*, Vol. 5187, 176, (2004), both of which are incorporated herein by reference in their entireties.

A major problem in manufacturing practical III-Nitride based sources, such as AlGaN alloys, is the lack of a native substrate for the homoepitaxial growth of epilayers. Consequently, most devices are deposited heteroepitaxially on lattice mismatched substrates, like sapphire or SiC, with the resulting layer quality limited by the high density of threading dislocations produced therein. Such threading dislocations present in AlGaN alloys deposited heteroepitaxially on lattice mismatched substrates are associated with non-radiative recombination centers that compete with radiative recombination paths, thus reducing the radiative recombination efficiency of these materials. One method for reducing the number of dislocations in III-nitride materials deposited by molecular beam epitaxy is to employ III-Nitride templates as a substrate that consists of an (In)(Ga)(Al)N thin film deposited upon a substrate, commonly sapphire or SiC, by a high temperature growth process (>1000° C.) such as metalorganic chemical vapor deposition or hydride vapor phase epitaxy.

With regard to optical sources, these threading dislocations present in AlGaN alloys deposited heteroepitaxially on lattice mismatched substrates greatly reduce the wall plug efficiency (i.e., the ratio of the power of the light emitted versus the electrical power applied). Currently, the best reported UV light emitting diodes (LED) have very low wall plug efficiencies, ~1% or below, with the remaining input power being converted to heat. See A. Khan, *Light-Emitting Diodes: Research, Manufacturing, and Applications VII*, SPIE Vol. 4996, (2003); T. M. Katona, T. Margalith, C. Moe, M. C.

Schmidt, S. Nakamura, J. S. Speck, S. P. DenBaars, *Third International Conference on Solid State Lighting*, SPIE Vol. 5187, (2004); K. B. Nam, J. Li, M. L. Nakarmi, J. Y. Lin, and H. X. Jiang, *Appl. Phys. Lett.* 84, 5264 (2004); S. Wieczorek, W. W. Chow, S. R. Lee, A. J. Fisher, A. A. Allerman, and M. H. Crawford, *Appl. Phys. Lett.* 84, 4899 (2004); M. H. Crawford, A. A. Allerman, A. J. Fisher, K. H. A. Bogart, S. R. Lee, R. J. Kaplar, W. W. Chow, and D. M. Follstaedt, *Light-Emitting Diodes: Research, Manufacturing, and Applications VIII*, SPIE Vol. 5366, (2004); A. Chitnis, J. Sun, V. Mandavilli, R. Pachipulusu, S. Wu, M. Gaevski, V. Adivarahan, J. P. Zhang, M. Asif Khan, A. Sarua, and M. Kuball, *Appl. Phys. Lett.* 81, 3491 (2002); V. Adivarahan, S. Wu, J. P. Zhang, A. Chitnis, M. Shatalov, V. Mandavilli, R. Gaska, and M. Asif Khan, *Appl. Phys. Lett.* 84, 4762 (2004); V. Adivarahan, W. H. Sun, A. Chitnis, M. Shatalov, S. Wu, H. P. Maruska, and M. Asif Khan, *Appl. Phys. Lett.* 85, 2175 (2004), each of which are incorporated herein by reference in their entireties.

The low wall plug efficiency further results in excessive heating of the UV LED material, which reduces the lifetime thereof, and may change the spectral and power output properties of UV LEDs. For these reasons, such UV LED devices are commonly pulsed in operation, such that the duty cycle is kept low enough to reduce undesirable heating effects on the UV LED material. Extracting the heat from these devices can also be challenging since the most commonly used substrate, sapphire, is a poor thermal conductor at room temperature. This difficulty in heat extraction requires elaborate packaging of the UV LED material, such as including flip-chip bonding of the final device to a thermally conductive substrate to help conductively dissipate the heat. These devices then emit light through the sapphire substrate, and are referred to as "back-emitters".

The red-shifts in the enhanced luminescence seen in In(Al)GaN quaternary alloys are much larger than those typically reported for $Al_xGa_{1-x}N$ alloys of comparable Al content (~10 to 50 meV). These $Al_xGa_{1-x}N$ alloys are referred to herein as band edge AlGaN alloys. Accordingly, it has been found that the large compositional fluctuations, i.e., localized inhomogeneities resulting in the desirable carrier localization that leads to an enhancement in the radiative efficiency, obtained using the current growth methods of $In_xGa_{1-x}N$ alloys do not occur when using such methods to grow $Al_xGa_{1-x}N$ alloys needed for the production of UV LEDs. In fact, it has been previously believed that AlGaN material systems cannot have unstable mixing regions (i.e., localized inhomogeneities) that would result in phase separation, as is the case for InGaN materials. See T. Matsuoka, Calculation of unstable mixing region in wurtzite InGaAlN, Applied Physics Letters 71, 105 (1997).

These smaller red-shifts found in the band edge $Al_xGa_{1-x}N$ alloys of comparable Al content (~10 to 50 meV) are often attributed to emission from bandtails associated with small alloy fluctuations and structural disorder. See Y. H. Cho, G. H. Gainer, J. B. Lam, W. Yang, W. Jhe, and J. J. Song, *Phys. Rev. B* 61, 7203 (2000); A. Bell, S. Srinivasan, C. Plumlee, H. Omiya, F. A. Ponce, J. Christen, S. Tanaka, A. Fujioka, and Y. Nakagawa, *J. Appl. Phys.* 95, 4670 (2004); H. S. Kim, R. A. Mair, J. Li, J. Y. Lin, and H. X. Jiang, *Appl. Phys. Lett.* 76, 1252 (2000), each of which are incorporated herein by reference in their entireties. While $Al_xGa_{1-x}N$ on sapphire possesses long-lived low temperature photoluminescence (PL) on the order of 250-600 picoseconds (ps), a significant reduction in PL lifetime, to less than 20 ps at room temperature, is generally observed due to thermally activated trapping and non-radiative recombination at defect sites in the $Al_xGa_{1-x}N$ alloy.

These short room temperature lifetimes found in UV LED's comprising band edge $Al_xGa_{1-x}N$ on sapphire correspond to low wall plug efficiencies, as discussed above. Without the availability of lattice matched substrates with reduced defect density, or the advantages of compositional fluctuations (i.e., localized inhomogeneities) found in InGaN alloys made using the conventional methods of production, production of efficient UV LED using band edge AlGaN alloys has been found to be practically impossible.

Most conventional UV LED's are based on the same basic device structure. The substrate preparation and the nucleation steps for epilayer growth, however, are dependent upon the chemistry of the substrate used. These processes, as well as the subsequent buffer layers deposited, greatly affect the number of defects in the material. For example, in a conventional UV LED device structure, a thick silicon-doped n-type $Al_xGa_{1-x}N$ layer is grown to function as the bottom current-spreading layer of the UV LED device. For a back-emitter device, as described above, the AlN mole fraction of this current-spreading layer is made large enough to ensure that the current-spreading layer is transparent to the light emitted from the active region layer.

Next, a multiple quantum well (MQW) active region layer is deposited upon the current-spreading layer, with the number and thickness of the multiple quantum wells formed within the MQW layer depending on the particular device. This MQW layer is then generally capped with an AlGaN electron blocking layer, the AlGaN electron blocking layer optionally being doped p-type. Next, a p-type GaN contact layer is formed upon the AlGaN electron blocking layer. The p-type GaN contact layer is required due to the difficulties in doping AlGaN p-type.

The p-type GaN contact layer may optionally be replaced by many different AlGaN p-type layers depending on the particular device. If the MQW active region layer is replaced, for example, by an AlGaN layer with one aluminum percentage, then the device is called a double-heterostructure (DH) LED. While this conventional UV LED device structure is simple to grow, it is not possible to produce efficient DH-UV LEDs using the above-described method, due to the susceptibility of the active region layer to the non-radiative recombination centers typically found in these materials, polarization fields that tend to separate the electron hole pairs, and the lack of quantum confinement to improve electron-hole wave function overlap. The latter two reasons lead to a longer radiative lifetime in the bulk active layers that does not compete favorably with the non-radiative processes.

One method for depositing III-Nitride films is a technique called molecular beam epitaxy (MBE). This technique is a thin film deposition process in which thermal beams of atoms or molecules react on the clean surface of a substrate, held at high temperatures and under ultra-high vacuum conditions. The material sources for III-Nitride semiconductors traditionally consist of solid elemental constituent sources of gallium (Ga), aluminum (Al) and indium (In), that evaporate from the melt, as well as n- and p-type dopant sources silicon (Si) and magnesium (Mg) that sublimate. Since molecular nitrogen ($N_2$) does not crack on the substrate surface, plasma sources are employed to generate active nitrogen species from this gas source. Accordingly, this molecular beam epitaxy technique is commonly referred to as plasma-assisted molecular beam epitaxy (PA-MBE).

In this method, crystal growth is performed in a chamber with ultra-high vacuum ($<10^{-9}$ Torr) base pressure (not including the partial pressure of source gases) that allows for the deposition of high-purity materials at lower substrate temperatures than typically employed by vapor deposition techniques. This environment allows for the use of a number of in-situ probes, one of the most common being reflection high energy electron diffraction (RHEED). In this technique, a high energy (10 to 30 keV) electron beam is directed at the substrate at a grazing angle (~1° with respect to the surface.

Since the penetration depth of the beam is only a few atomic layers, the crystalline surface acts as a two-dimensional grating that diffracts electrons. The diffraction pattern can be observed on a fluorescent screen located inside the MBE chamber. A film having a smooth surface, as illustrated in the SEM photograph of the conventional GaN layer grown at a high Ga flux shown in FIG. 1(a), is expected to have a pattern consisting of a series of streaks perpendicular to the substrate surface, as illustrated in FIG. 1(b), while a rough or polycrystalline film, as illustrated in the SEM photograph of a GaN layer grown at a low Ga flux, as illustrated in FIG. 2(a), would have a spotty pattern, as illustrated in FIG. 2(b).

Extensive work has been performed in this field on the growth of GaN using PA-MBE. It is known that two of the most important growth parameters for the deposition of high quality GaN epilayers are the substrate temperature and the group-III/group-V atomic flux ratio. Unlike the deposition of other III-V compounds by MBE, it is well known that high quality, smooth GaN films are deposited under a Ga-rich (N-limited) growth regime. This is due to the highly reactive nature of the active nitrogen species generated by the plasma source that results in very short adatom diffusion lengths.

Suitable parameter space for depositing GaN has been reported upon, and three distinct growth regimes identified, referred to as the N-stable, intermediate Ga stable and Ga droplets, as illustrated in FIG. 3 (See B. Heying, R. Averbeck, L. F. Chen, E. Haus, H. Reichert, J. S. Speck, "Control of surface morphologies using plasma-assisted molecular beam epitaxy", Journal of Applied Physics, 88, 1855 (2000)). The boundary between the N-stable and the intermediate Ga stable regimes constitutes conditions that are nearly stoichiometric where the active nitrogen atom flux equals the Ga atom flux, and was determined by examining the dependence of the growth rate of the GaN film on the Ga atom flux.

The growth rate of GaN has been found to be independent of Ga atom flux (or Ga atom arrival rate) only within the intermediate Ga stable and Ga-rich regimes. Heavily Ga-rich growth conditions results in the accumulation of liquid Ga metal droplets on the surface of the film. Increasing the substrate temperature during growth has been observed to widen the range of Ga atom fluxes that result in intermediate Ga stable for a given active nitrogen flux.

As illustrated in FIG. 3, and as mentioned above, GaN film can be grown under three distinct growth regimes, i.e., the N-stable, intermediate Ga stable and Ga droplets. The surface morphology and optical properties of the GaN film have all been observed to depend upon the regime (method) of growth employed. Heying, et al. have reported on the surface morphologies of GaN films deposited within each regime, and have observed that films deposited under N-stable conditions had morphologies that were rough and heavily pitted, while films grown within the intermediate regime had large flat areas between large irregularly shaped pits. In contrast, films deposited in the Ga droplet regime had atomically flat surfaces.

The present inventors have investigated the impact of III/V flux ratio on the continuous wave photoluminescence observed from GaN films, and have found that films grown near stoichiometric conditions (i.e., where III/V flux ratio ~1) had significantly more intense band-edge luminescence than films grown at higher UV flux ratio. Similarly, the present inventors observed that films deposited near stoichiometric conditions had significantly longer photogenerated carrier lifetimes. These results are believed to be attributable to a high density of deep trap states in films deposited with higher III/V flux ratio.

In contrast to GaN, comparatively less has been reported on the growth of $Al_xGa_{1-x}N$ films by PA-MBE, which are useful in producing UV LED's. The present inventors have discovered that the AlN mole fraction of this ternary alloy ($Al_x Ga_{1-x}N$) is dependent upon the ratio of the Al/Ga atomic flux, the ratio of the total group III/group V atomic flux, as well as the substrate temperature. It has been previously observed that the AlN mole fraction of AlGaN alloys, deposited under constant Al/Ga atomic flux ratio, increases with increasing III/V flux ratio. This has been attributed to the preference for Al to incorporate into the film over Ga, due to the greater thermal stability of AlN over GaN. Presently, however, a growth diagram (methodology for production) for AlGaN alloys, comparable to the one developed for GaN as discussed above, has not been reported.

In view of the above, it is an object of the present invention to provide an AlGaN composition for use as an active region layer of a UV light emitting device, in which the active region layer's composition has localized inhomogeneities therein, resulting in carrier localization and enhanced radiative efficiency, and a UV light emitting device containing same.

It is a further object of the present invention to provide a method of manufacturing an AlGaN composition for use as an active region layer of a UV light emitting device, in which the active region layer has localized inhomogeneities formed therein, resulting in carrier localization and enhanced radiative efficiency, and a UV light emitting device containing same, as described above.

SUMMARY OF THE INVENTION

In order to achieve the objects of the present invention, as discussed above, the present inventors earnestly endeavored to overcome the difficulties in manufacturing a UV LED composition comprising AlGaN as the active region layer, a method of producing such a composition, and a device containing same. Accordingly, the present inventors have developed a UV LED AlGaN composition active region layer having localized inhomogeneities resulting in carrier localization and enhanced radiative efficiency, and a suitable manufacturing method therefor. As such, in a first embodiment of the present invention, a semiconductor-based ultraviolet light emitting device composition is provided, comprising:

a group III-Nitride containing AlGaN alloy having nanometer-scale localized compositionally inhomogeneous regions, wherein, when the alloy is optically or electrically injected or pumped, then luminescence occurs due to radiative recombination of carriers in the nanometer-scale size inhomogeneous regions having band-gap energies less than surrounding material.

In a second embodiment of the present invention, the semiconductor-based ultraviolet light emitting device composition of the first embodiment is provided, wherein the group III-Nitride containing AlGaN alloy is a layer having a thickness of about 50 nm or greater.

In a third embodiment of the present invention, the semiconductor-based ultraviolet light emitting device composition of the first embodiment is provided, wherein the group III-Nitride containing AlGaN alloy contains an AlN mole fraction of between about 20 to 80%.

In a fourth embodiment of the present invention, the semiconductor-based ultraviolet light emitting device composition of the first embodiment above is provided, wherein the group III-Nitride containing AlGaN alloy has a fine scale facetted surface morphology having pits with diameters of about 10 to 100 nm formed therein.

In a fifth embodiment of the present invention, the semiconductor-based ultraviolet light emitting device composition of the first embodiment above is provided, wherein the group III-Nitride containing AlGaN alloy is doped with an impurity.

In a sixth embodiment of the present invention, the semiconductor-based ultraviolet light emitting device composition of the fifth embodiment above is provided, wherein the impurity is selected from the group consisting of silicon (Si), magnesium (Mg), beryllium (Be), germanium (Ge) or carbon (C).

In a seventh embodiment of the present invention, the semiconductor-based ultraviolet light emitting device composition of the sixth embodiment above is provided, wherein the group III-Nitride containing AlGaN alloy contains an impurity concentration of from $10^{14}$ to $10^{20}$ atoms/cm$^3$.

In an eighth embodiment of the present invention, a semiconductor-based ultraviolet light emitting device is provided comprising:
  an n-type semiconductor layer;
  a p-type semiconductor layer; and
  an active region layer comprising the composition of the first embodiment above disposed, said active layer disposed between the n-type semiconductor layer and the p-type semiconductor layer.

In a ninth embodiment of the present invention, a semiconductor-based ultraviolet light emitting device is provided, comprising:
  a substrate;
  a first Si-doped AlGaN current spreading layer grown atop the substrate having a Si concentration of about $5 \times 10^{18}$ atoms/cm$^3$ or more;
  a second Si-doped AlGaN based group III-Nitride active region layer grown atop the first Si doped AlGaN layer having a Si concentration of about $1 \times 10^{16}$ to $1 \times 10^{18}$ atoms/cm$^3$; and
  an AlGaN electron blocking layer grown atop the second Si-doped AlGaN layer.

In a tenth embodiment of the present invention, a semiconductor-based ultraviolet light emitting device is provided, comprising:
  a first substrate layer;
  a second n-AlGaN band-edge layer disposed atop the first substrate layer;
  a third group III-Nitride containing AlGaN alloy active region layer disposed atop the second n-AlGaN layer, containing an AlGaN alloy having nanometer-scale localized compositionally inhomogeneous regions therein; and a fourth p-AlGaN band-edge layer disposed atop the third group III-Nitride active region layer,
  wherein the third group III-Nitride active region layer has an AlN mole fraction that is less than an MN mole fraction of the second n-AlGaN band-edge layer and fourth p-AlGaN band-edge layer.

In an eleventh embodiment of the present invention, the semiconductor-based ultraviolet light emitting device of the tenth embodiment is provided, wherein the third group III-Nitride containing AlGaN alloy is a layer having a thickness of about 5 nm or greater.

In a twelfth embodiment of the present invention, the semiconductor-based ultraviolet light emitting device of the tenth embodiment is provided, wherein the third group III-Nitride containing AlGaN alloy contains an AlN mole fraction of between about 20 to 80%.

In a thirteenth embodiment of the present invention, the semiconductor-based ultraviolet light emitting device of the tenth embodiment above is provided, wherein the third group III-Nitride containing AlGaN alloy has a fine scale facetted surface morphology having pits with diameters of about 10 to 100 nm formed therein.

In an fourteenth embodiment of the present invention, the semiconductor-based ultraviolet light emitting device of the tenth embodiment above is provided, wherein the third group III-Nitride containing AlGaN alloy active region layer comprises a plurality of alternating layers of AlGaN alloy containing different AlN mole fractions and having nanometer-scale localized compositionally inhomogeneous regions therein, and band-edge AlGaN layers.

In a fifteenth embodiment of the present invention, the semiconductor-based ultraviolet light emitting device of the fourteenth embodiment above is provided, wherein the plurality of alternating layers of the third group III-Nitride containing AlGaN alloy active region layer have thicknesses differing from each other.

In a sixteenth embodiment of the present invention, the semiconductor-based ultraviolet light emitting device of the tenth embodiment above is provided, wherein the substrate is selected from the group consisting of a sapphire substrate, a group nitride substrate or template on a sapphire substrate, a SiC semiconductor substrate, a GaAs semiconductor substrate, an InP semiconductor substrate, a ZnO semiconductor substrate, an elemental Si semiconductor substrate, an elemental Ge substrate, or any other substrate upon which a single crystal 1H-Nitride film may be grown.

In a seventeenth embodiment of the present invention, a method of manufacturing an ultraviolet light emitting device having a group III-Nitride active region layer containing an AlGaN alloy is provided, comprising:
  epitaxially depositing, under a facetted or three-dimensional growth regime, a layer of $Al_xGa_{1-x}N$ on a substrate, or a film layer formed adjacent a substrate,
  wherein the substrate temperature is maintained within a temperature range of about 770 to 950° C., an $N_2$ flow rate of from 0.2 to 1.2 sccm (standard cubic centimeters per minute) is utilized, the layer of $Al_xGa_{1-x}N$ is grown at a rate of 80 to 1000 nm/hour, the Al beam equivalent pressure is from about $1 \times 10^{-8}$ to $2 \times 10^{-7}$, and the Ga beam equivalent pressure is from about $2 \times 10^{-7}$ to $2 \times 10^{-6}$ Torr.

In an eighteenth embodiment of the present invention, the method of manufacturing of the seventeenth embodiment above is provided, wherein the layer of $Al_xGa_{1-x}N$ is epitaxially deposited at a rate of from 80 to 120 nm/hour.

In a nineteenth embodiment of the present invention, the method of manufacturing of the seventeenth embodiment above is provided, wherein the $N_2$ flow rate is from 0.2 to 0.6 sccm (standard cubic centimeters per minute).

In a twentieth embodiment of the present invention, the method of manufacturing of the seventeenth embodiment above is provided, wherein the $Al_xGa_{1-x}N$ layer is doped with a dopant selected from the group consisting of silicon (Si), magnesium (Mg), beryllium (Be), germanium (Ge) or carbon (C).

In a twenty first embodiment of the present invention, the method of manufacturing of the twentieth embodiment above is provided, wherein the $Al_xGa_{1-x}N$ layer is doped with an impurity in a concentration of from about $10^{14}$ to $10^{20}$ atoms/cm$^3$.

In a twenty second embodiment of the present invention, the method of manufacturing of the twenty first embodiment above is provided, wherein the $Al_xGa_{1-x}N$ layer contains an AlN mole fraction of about 33% and is doped with Si.

In a twenty third embodiment of the present invention, the method of manufacturing of the sixteenth embodiment above is provided, wherein the $Al_xGa_{1-x}N$ is heteroepitaxially deposited atop an AlN buffer layer employing a Ga flux of from $2 \times 10^{-7}$ to $7 \times 10^{-7}$ Torr.

DETAILED DESCRIPTION OF THE INVENTION

The present invention provides a semiconductor-based ultraviolet (UV) light emitting device active region AlGaN composition, for inclusion in a UV light emitting device operating at wavelengths of shorter than 360 nm. Further, the present invention provides a UV light emitting device comprised of a stack of layers that includes said active region layer, wherein light is generated through the radiative recombination of excited electron-hole pairs. These pairs can be created in the active region layer by either electrical injection, or by an optical/electron-beam pump. The active region layer is an aluminum gallium nitride ($Al_xGa_{1-x}N$) based layer having localized inhomogeneities The present inventors further unexpectedly discovered a method of forming the active region layer's composition, so as to create these localized inhomogeneities, the inclusion of which results in improved wall plug efficiency for the device through enhancement of the radiative recombination efficiency in the active region layer, as well as enhanced light emission.

Figure 1:
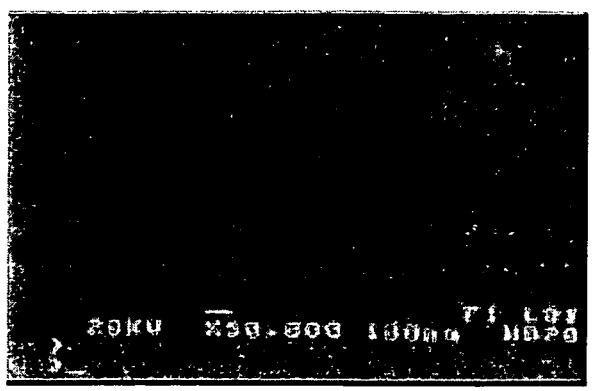
FIG. 1(a) is a digital representation of the surface morphology of a GaN layer grown at a high Ga flux. The digital representation was produced by a scanning electron microscope (SEM).
FIG. 1(b) is a digital representation of a reflection high energy electron diffraction (RHEED) pattern observed for the GaN layer whose surface morphology is shown in FIG. 1(a).
Figure 1:
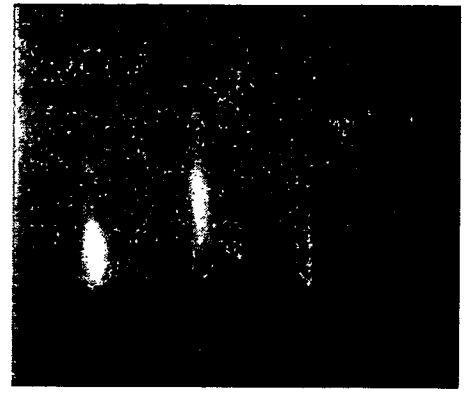
Figure 2:
FIG. 2(a) is a digital representation of the surface morphology of a GaN layer grown at a low Ga flux, according to the invention. The digital representation was produced by a SEM
FIG. 2(b) is a RHEED pattern of the GaN layer shown in FIG. 2(a).
Figure 2:
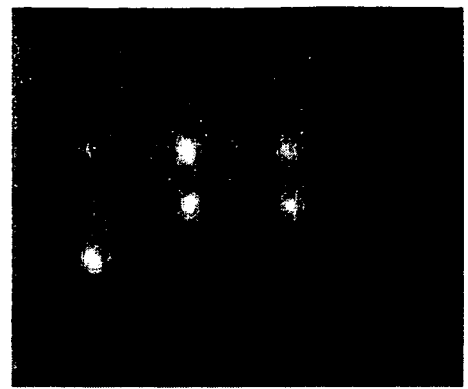
Figure 3:
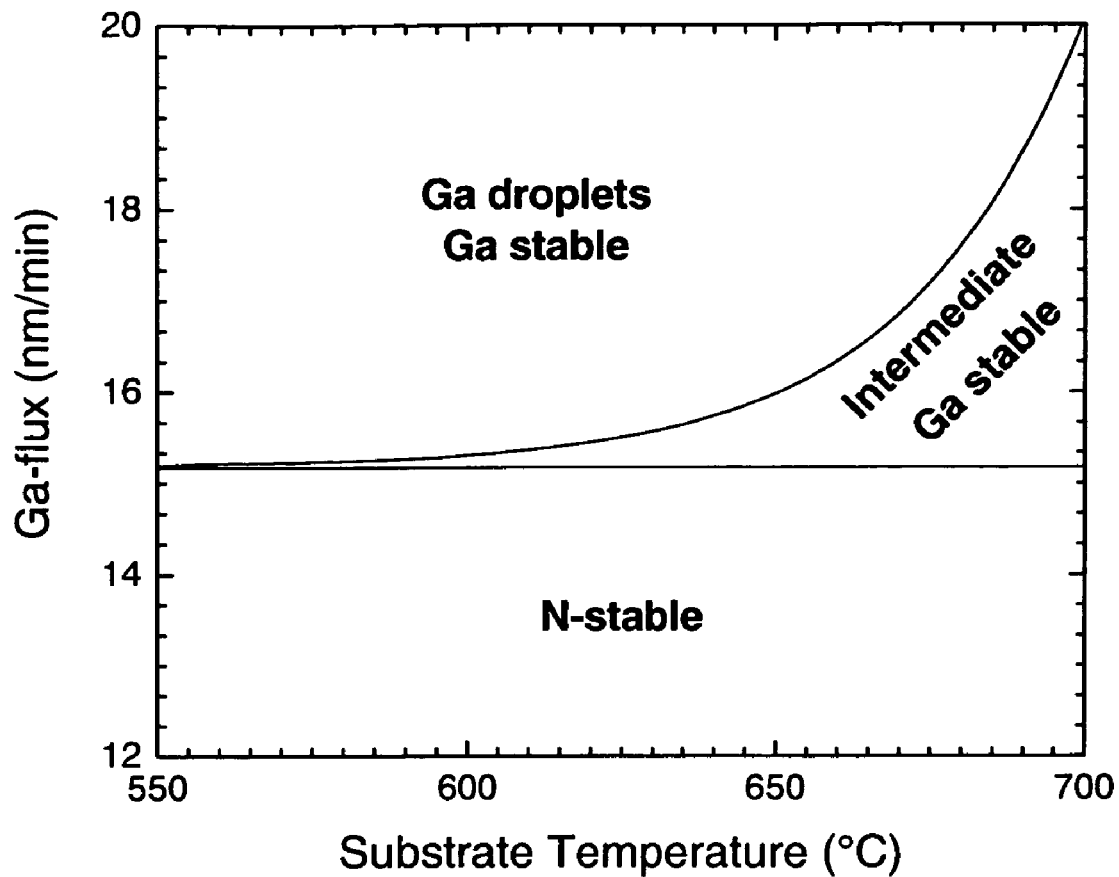
FIG. 3 is graph of Ga-flux vs. substrate temperature, illustrating the three distinct growth regimes, referred to as the N-stable, intermediate Ga stable and Ga droplets. B. Heying, R. Averbeck, L. F. Chen, E. Haus, H. Reichert, J. S. Speck, "Control of surface morphologies using plasma-assisted molecular beam epitaxy", Journal of Applied Physics, 88, 1855 (2000).
Figure 4A:
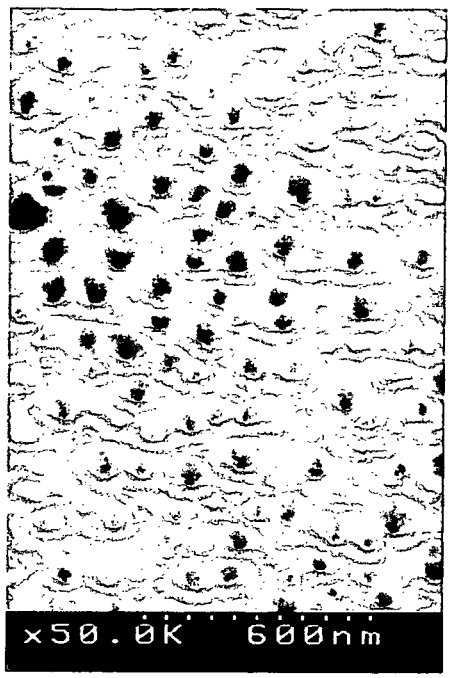
FIG. 4(a) is a digital representation of the surface morphology (obtained by a SEM) of an AlGaN film produced at a low Ga atom flux of about $3.3 \times 10^{-7}$ Torr as measured by beam equivalent pressure, according to the invention, illustrating the fine scale, facetted surface morphology obtained with the method of the present invention, having surface pits on the order of about 10 to 100 nm wide.

In particular, as illustrated in the scanning electron microscopy (SEM) image of the surface of an AlGaN film according to the present invention of FIG. 4(a) herein, the present invention provides UV light emitting device active region layer compositions comprised of aluminum and gallium containing III-Nitride alloys that exhibit enhanced photoluminescence (PL) lifetimes due to compositional fluctuations (i.e., localized inhomogeneities) therein. As shown in FIG. 4(a), the surface of an AlGaN film produced at a low Ga atom flux of about $3.3\times10^{-7}$, as measured by beam equivalent pressure, according to the present invention, has a fine scale, facetted surface morphology, having surface pits on the order of about 10 to 100 nm wide.

Figure 5:
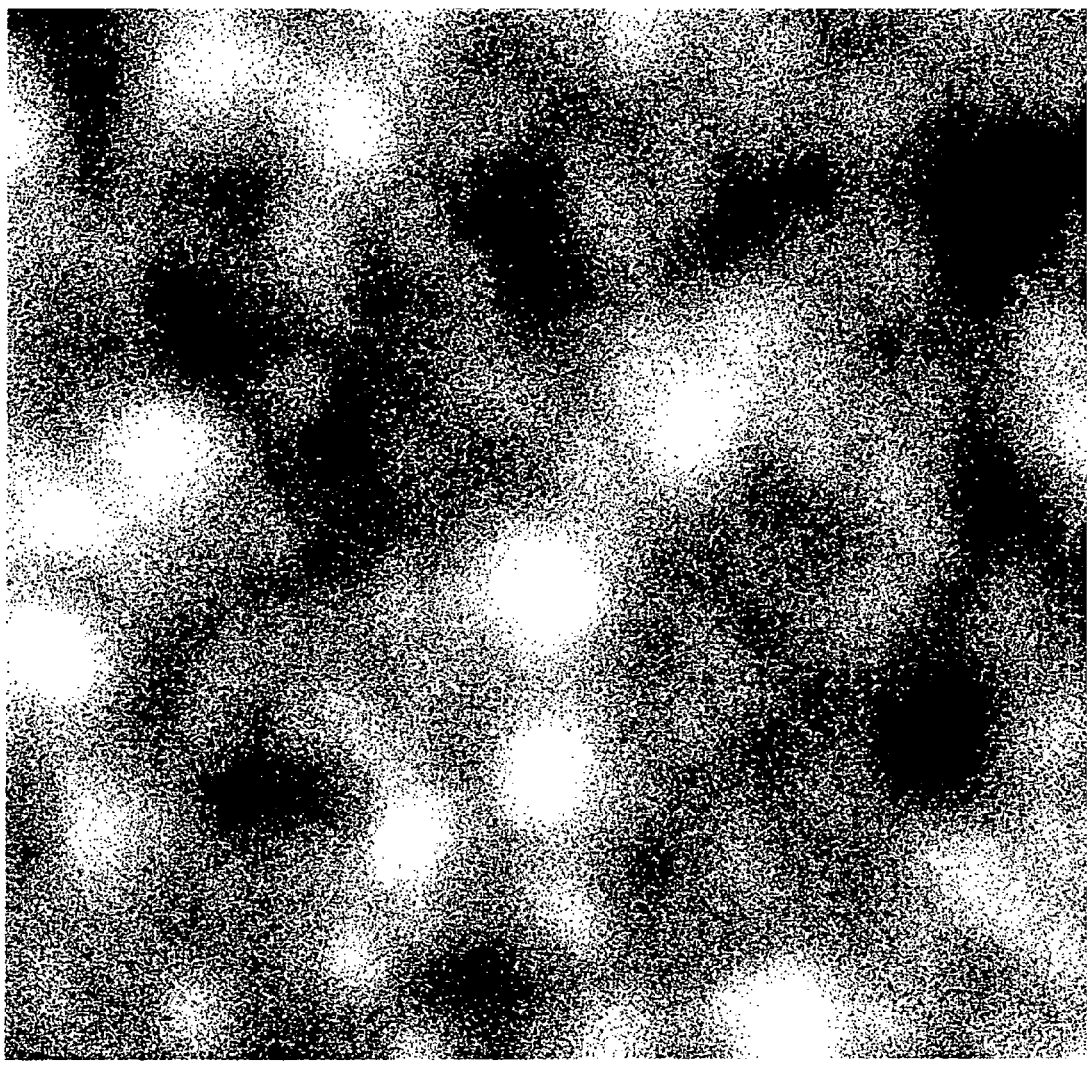
FIG. 5 is a room-temperature monochromatic cathodoluminescence (CL) image of the group III-nitride containing AlGaN alloy composition of the present invention, illustrating the luminescence obtained from the localized inhomogeneous regions of AlGaN (i.e., areas of the AlGaN composition in which the Al percentage varies) that are of smaller band gap energy than the surrounding material and act as radiative recombination centers.

The compositional fluctuations, as illustrated in the room-temperature monochromatic cathodoluminescence (CL) image of the AlGaN active region layer of the present invention of FIG. 5 herein, are nanometer scale, compositionally inhomogeneous regions of AlGaN (i.e., areas of the AlGaN composition in which the Al percentage varies) that are of smaller band gap energy than the surrounding material and act as radiative recombination centers.

These aluminum and gallium containing III-Nitride alloys function as the active region layer in UV light emitting semiconductor layer stacks commonly referred to as ultraviolet light devices. Such devices, and methods for manufacturing same by depositing the active region layer alloys under a facetted and/or three-dimensional growth mode, are provided herein.

Figure 4C:
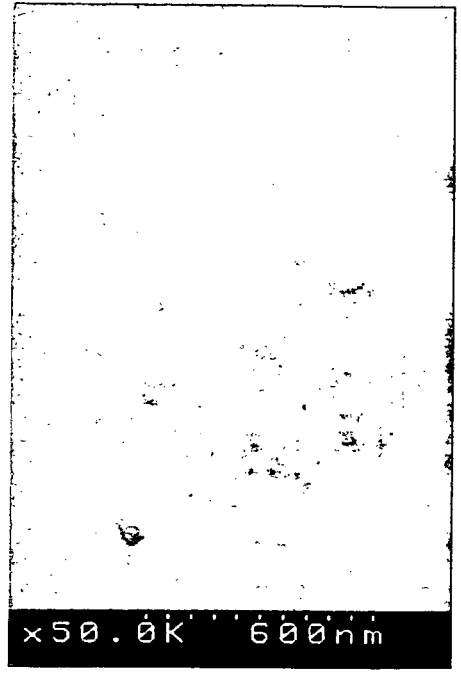
FIG. 4(c) is a digital representation of the surface morphology (obtained by a SEM) of an AlGaN film produced at a high Ga atom flux of about $5.62 \times 10^{-7}$ Torr, as measured by beam equivalent pressure, illustrating the smooth surface morphology of films produced at a high Ga atom flux.
Figure 4B:
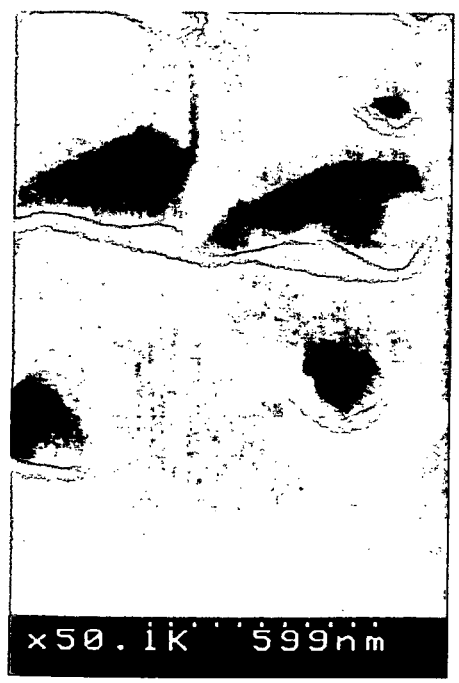
FIG. 4(b) is a digital representation of the surface morphology (obtained by a SEM) of an AlGaN film produced at a very high Ga atom flux of about $6.16 \times 10^{-7}$ Torr, as measured by beam equivalent pressure, showing large scale facetting evidencing metal droplets.

In contrast, conventionally, AlGaN films are produced at a very high Ga atom flux of, for example, about $6.16\times10^{-7}$ (as measured by beam equivalent pressure), which may lead to a surface morphology having large scale facetting evidencing metal droplets, as illustrated in FIG. 4(b). Alternatively, as illustrated in FIG. 4(c), the surface of an AlGaN film produced at a high Ga atom flux of about $5.62\times10^{-7}$ (as measured by beam equivalent pressure), may have a smooth surface morphology.

Figure 6:
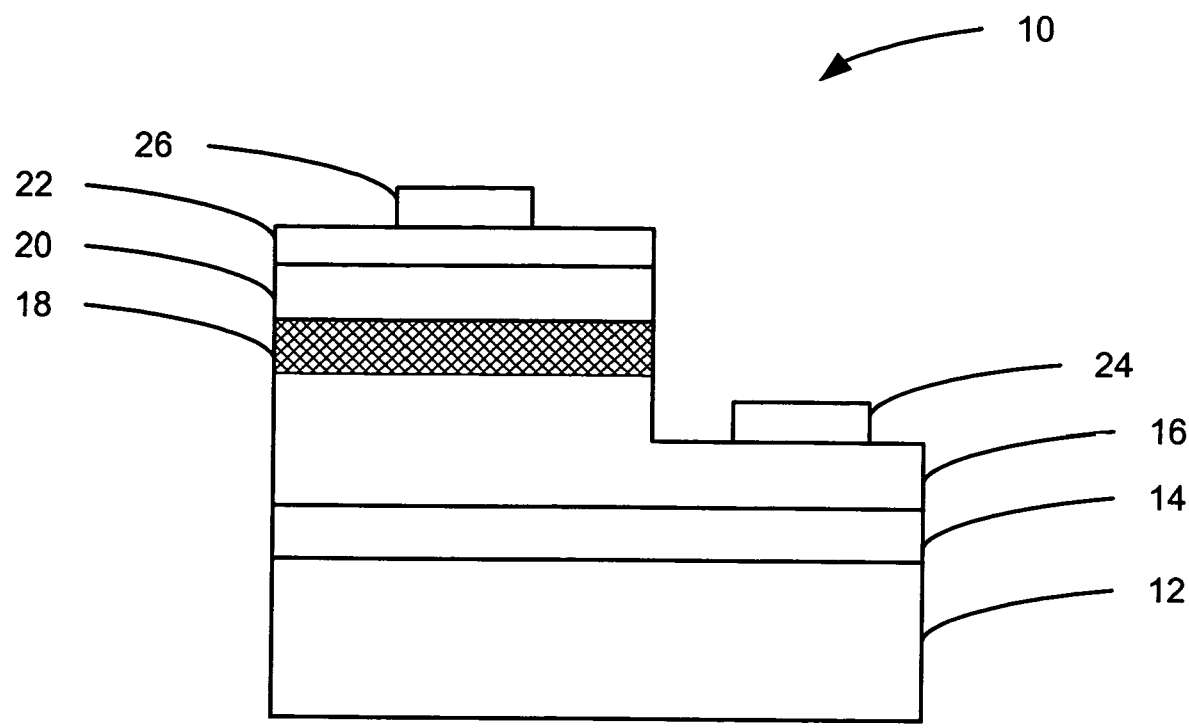
FIG. 6 is cross sectional view of the semiconductor-based ultraviolet light emitting device of the present invention.

As illustrated in FIG. 6, the active region layer of the present invention as described above may be incorporated into a semiconductor UV light emitting diode (UVLED) 10 of the present invention comprising a substrate 12, an AlN buffer layer 14 deposited atop the substrate 12, and a silicon doped n-type $Al_xGa_{1-x}N$ current spreading layer 16 grown atop the AlN buffer layer 14. The MN buffer layer is optionally provided, and not used when employing a nitride substrate or template. An active region layer 18, comprised of the group III-Nitride containing AlGaN alloy having nanometer-scale localized compositionally inhomogeneous regions therein of the first embodiment herein, is epitaxially grown atop the current spreading layer 16. The active region layer 18 is capped with an AlGaN electron blocking layer 20 and a p-type GaN contact layer 22.

The substrate may be a sapphire substrate, a group III-V nitride substrate or template on a sapphire substrate, a SiC semiconductor substrate, a GaAs semiconductor substrate, an InP semiconductor substrate, a ZnO semiconductor substrate, an elemental Si semiconductor substrate, an elemental Ge semiconductor substrate or any other substrate upon which a single crystal III-Nitride film may be grown. The AlGaN electron blocking layer 20 may or may not be doped p-type. An n-electrode 24 and a p-electrode 26 are provided for connectivity.

Figure 7A:
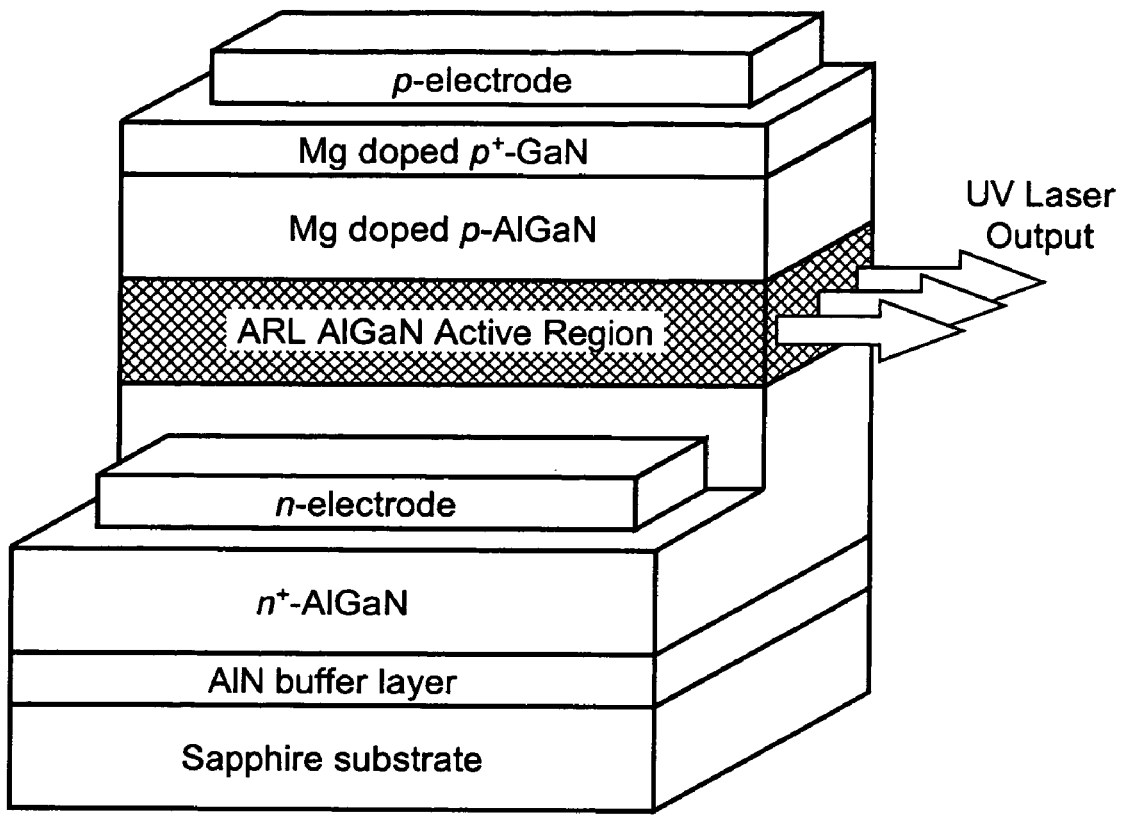
FIG. 7(a) is a perspective view of a semiconductor-based ultraviolet light emitting device of the present invention, wherein the device is structured as a laser diode (LD).
Figure 7B:
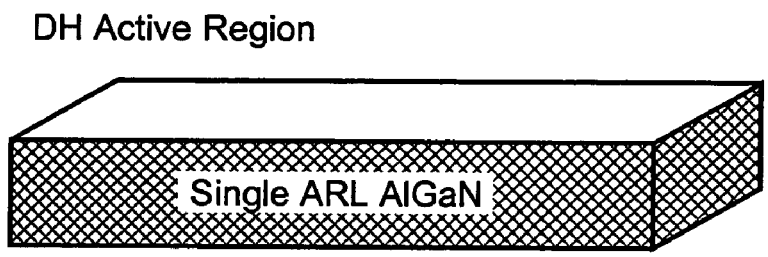
FIG. 7(b) is a perspective view of the single AlGaN active region layer shown in FIG. 7(a).

The active region layer 18 may, as illustrated in FIGS. 7(a) and 7(b), consist of a single group III-Nitride active region layer containing an AlGaN alloy having nanometer-scale localized compositionally inhomogeneous regions therein. If the active region layer of the semiconductor UV LED is grown as a single AlGaN layer with an aluminum percentage that is substantially the same as the band-edge n-AlGaN layer beneath it and the band-edge p-AlGaN layer above it, then the semiconductor device is referred to as a homojunction LED structure.

In a preferred embodiment of the present invention, as illustrated in FIGS. 7(a) and 7(b), the active region layer 18 of the UV LED 10 is a single AlGaN layer grown with an aluminum percentage that is less than the n-AlGaN layer below and the p-AlGaN layer above. Such a device is referred to as a double-heterojunction (DH) LED structure.

Figure 8A:
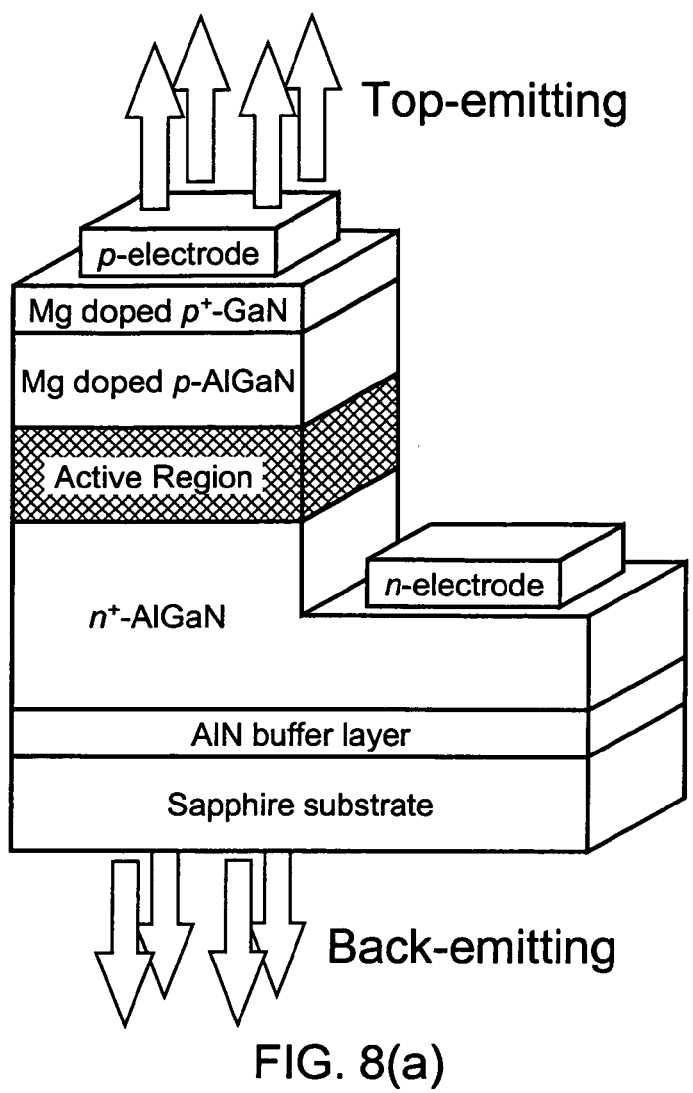
FIG. 8(a) is a perspective view of a semiconductor-based ultraviolet light emitting device of the present invention, wherein the device is structured as a top and back emitting light emitting diode (LED).
Figure 8B:
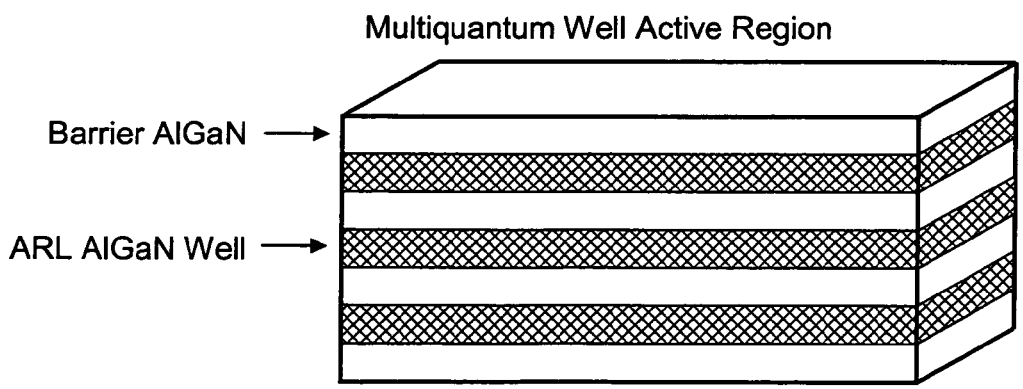
FIG. 8(b) is a perspective view of the AlGaN-containing active region layer shown in FIG. 8(a), wherein the active region layer consists of multiple AlGaN layers of alternating band-edge AlGaN and the AlGaN alloy of the present invention having localized inhomogeneities present therein and having an AlN mole fraction smaller than the band edge AlGaN alloy. Such a device is referred to as a multiple quantum well (MQW) LED structure.

In another preferred embodiment of the present invention, as called for in the fourteenth embodiment herein and as illustrated in FIGS. 8(a) and 8(b), the active region layer 18 of the UV light emitting device 10 may consist of multiple layers of band-edge AlGaN with alternating AlN mole fractions. For example, one period of such a structure would consist of one layer of AlGaN with a higher Al percentage and a wider bandgap, and one layer with a lower Al percentage and a smaller bandgap. Both of these layers may contain the nanoscale compositional inhomogeneities described in the first embodiment herein or, alternatively, only the smaller bandgap material may contain them. Such a device is referred to as a multiple quantum well (MQW) or superlattice LED structure.

Figure 9:
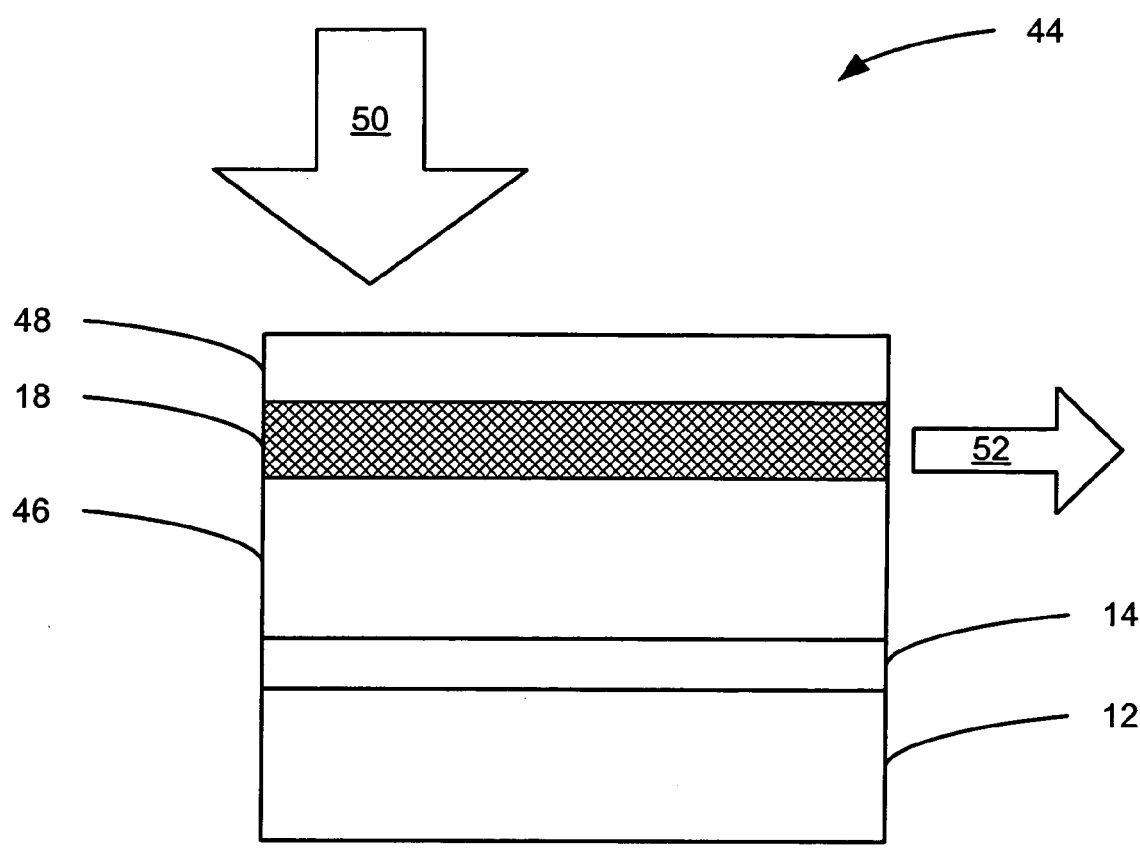
FIG. 9 is a cross sectional view of a UV light emitting device of the present invention structured to operate as an LD (laser diode) using either optical carrier injection or electron beam carrier injection.
Figure 10:
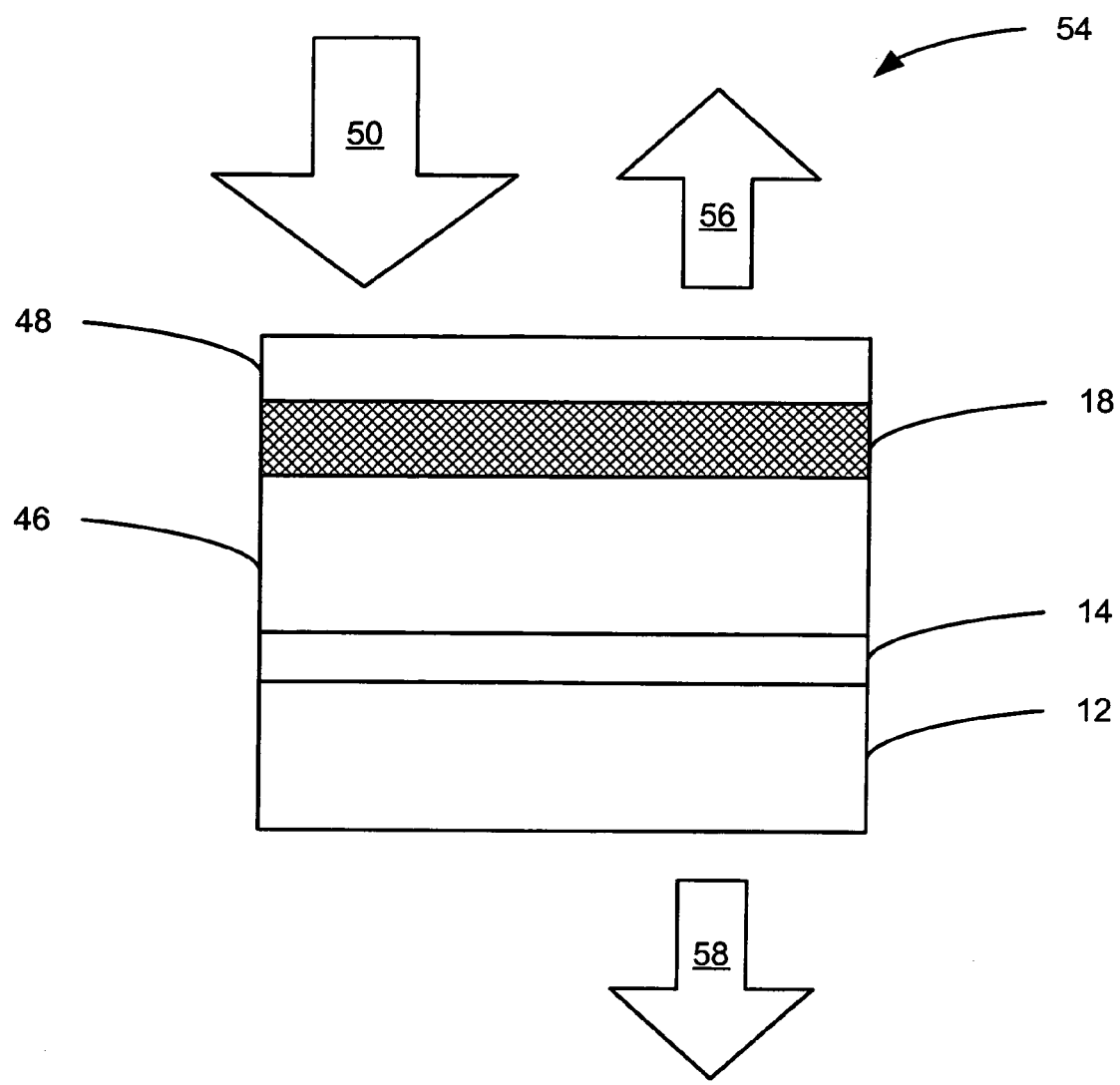
FIG. 10 is a cross sectional view of a carrier injection LED which is top emitting and bottom emitting, designed for injection of electrons or holes through a carrier injection pump.

The UV light emitting device of the present invention may be structured to operate as an LD (laser diode), as shown in FIG. 9, or as an LED, as shown in FIG. 10, using either optical carrier injection or e-beam carrier injection. As shown in FIG. 9, an LD 44 is designed for injection of electrons or holes through a carrier injection pump 50. The carrier injection pump 50 may be an optical pump or an e-beam pump. A first band-edge AlGaN layer 46 which may comprise one or multiple layers, 46 is deposited on the substrate 12 and an optional AlN buffer layer 14 if required.

Optionally, (Al)(In)(Ga)N could be used in place of AlN for the buffer layer 14. The active region layer 18 is formed on the band-edge AlGaN layer 46, and a second band-edge AlGaN layer 48 is formed on the active region layer 18. The band-edge AlGaN layers 46 and 48 have a higher Al content than that of the active region layer matrix to ensure waveguiding of the emitted light. The LD 44 is an edge-emitting device, as illustrated by the UV laser output 52.

FIG. 10 illustrates an LED 54 which, like the LD 44 shown in FIG. 9, is also designed for injection of electrons or holes through a carrier injection pump 50. The LED structure is formed similarly to the LD structure, i.e., via depositing a first band-edge AlGaN layer 46 on a substrate 12 and an optional AlN buffer layer 14 if required. The active region layer 18 is formed on the band-edge AlGaN layer 46, and a second band-edge AlGaN layer 48 is formed atop the active region layer 18. In contrast to the LD device, however, the carrier injection LED 54 is capable of top-emitting, illustrated by light emission 56, and/or bottom-emitting, illustrated by light emission 58.

If the carrier injection pump 50 is an optical pump, such that the carrier injection LD 44 and the carrier injection LED 54 are optically injected, then the AlGaN active region layer 18 or the surrounding layers, band-edge AlGaN layer 46 and band-edge layer 48, absorb the light from the optical pump, generating electron hole pairs. The generated electrons and holes can then recombine in the active region layer 18 to produce light.

The carrier injection pump 50 can also be an e-beam source. Using an electron beam source, the energetic electrons are injected into the active region layer 18 and/or the surrounding layers, band-edge AlGaN layer 46 and band-edge layer 48, and collide with electrons in the atoms with enough energy to cause the electrons to break free from the atoms. This produces electron hole pairs, similar to the optical pumping above, that can then recombine in the active region layer 18 to produce light.

Figure 11:
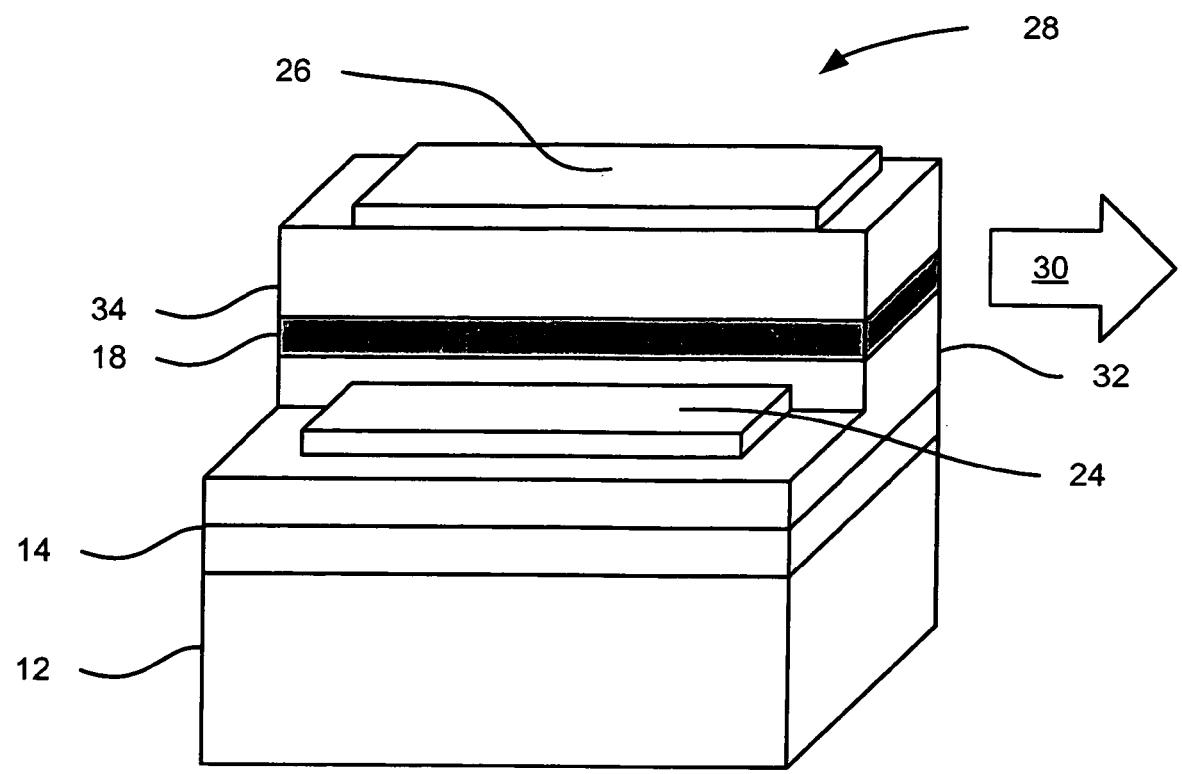
FIG. 11 is a perspective view of an LD structure according to the present invention.
Figure 12:
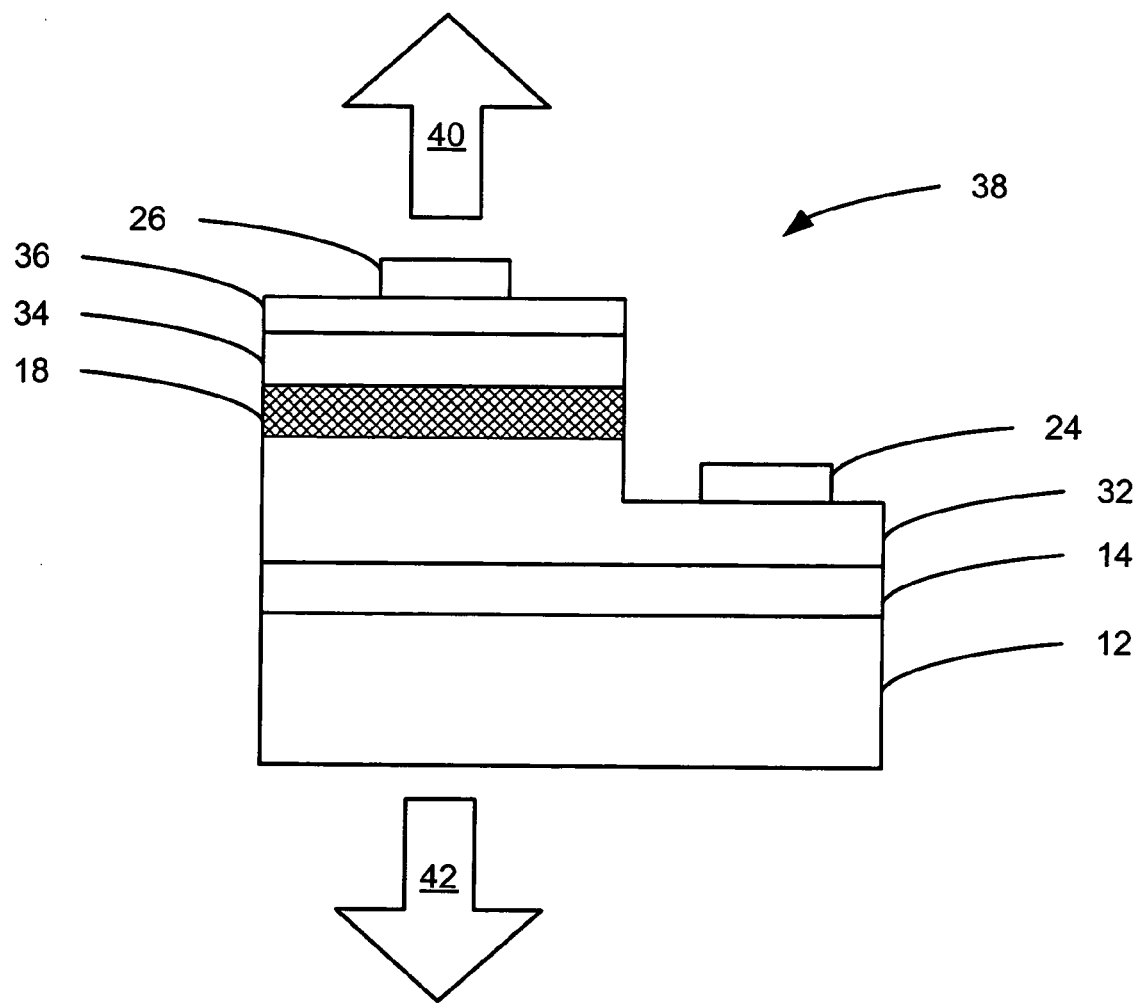
FIG. 12 is a cross sectional view of an LED structure according to the present invention.

Two common electrically injected devices are laser diodes (LD), as shown in FIG. 9 and FIG. 11, and light-emitting diodes (LEDs), as shown in FIG. 10 and FIG. 12. As illustrated in FIG. 11, the present invention provides an LD 28 structure 28 formed by sandwiching the active region layer 18 between an n-type semiconductor layer 32 and a p-type semiconductor layer 34, thus creating a p-n junction photodiode. The n-type semiconductor layer 32 may contain superlattices to improve current spreading and injection, and may contain some layers of a wider bandgap for waveguiding the emission.

The p-type semiconductor layer 34 may contain a wider bandgap electron blocking layer and other wider bandgap layers for waveguiding. The p-type semiconductor layer 34 may also contain superlattices to improve current spreading and injection. The electrons and holes are injected through the ohmic contacts into the active region layer 18 via the semiconductor layers 32 and 34, creating an electrically injected device.

The LD 28 shown in FIG. 11 is formed by optionally depositing an AlN buffer layer 14 on a suitable substrate 12, such as sapphire. An n-type semiconductor layer 32 is then deposited upon the AlN buffer layer 14. An AlGaN active region layer 18, as described above, is then deposited on the n-type semiconductor layer 32. A Mg doped $p^+$ semiconductor layer 34 is formed upon the active region layer 18. An n-electrode 24 formed upon the n-type semiconductor layer 32, and a p-electrode 26 formed upon the Mg doped $p^+$ semiconductor layer 34, are deposited for connectivity of the LD 28 to an injection source. The LD 28, shown in FIG. 11, is an edge-emitting device, as illustrated by the UV laser emission 30 therefrom.

The LED 38, shown in FIG. 12, is similarly formed by optionally depositing an AlN buffer layer 14 on a suitable substrate 12. An n-type semiconductor layer 32 is then deposited upon the AlN buffer layer 14. An AlGaN active region layer 18, as described above, is deposited upon the n-type semiconductor layer 32. A Mg doped $p^-$ semiconductor layer 34 of wider bandgap is deposited upon the active region layer 18 as an electron blocking layer. A Mg doped $p^+$ semiconductor layer 36 is then formed on the Mg doped $p^-$ semiconductor layer 34.

An n-electrode 24 and a p-electrode 26 are provided on the n-type semiconductor layer 32 and the Mg doped $p^+$ semiconductor layer 36, respectively, for connectivity of the device to an injection source. In contrast to the LD 28 shown in FIG. 11, the LED 38 shown in FIG. 12 may be top-emitting, as illustrated by the light emission 40, and/or bottom-emitting, as illustrated by the light emission 42.

As discussed above, the LD 28 and the LED 38 have similar layer structures, with varied thickness depending on whether it is an edge-emitting LD 28 or a top-emitting and/or bottom-emitting LED 38 structure. Both LD 28 and LED 38 can be grown with multiple arrangements of the AlGaN active region layer 18.

For a single AlGaN layer as disclosed earlier, when forming an active region layer of a semiconductor device as a single AlGaN layer grown with an aluminum percentage that is substantially the same as the band-edge n-AlGaN layer beneath it and the band-edge p-AlGaN layer above it, the semiconductor device is referred to as a homojunction LED structure.

Methods of Production

The present inventors unexpectedly discovered a regime (process) for growing ternary $Al_xGa_{1-x}N$ alloys by PA-MBE that results in films thereof having nanometer scale compositional inhomogeneities therein. These localized compositional inhomogeneities, as illustrated in FIG. 5 herein, provide the beneficial effect of promoting radiative recombination (generation of light) in regions of smaller AlN mole fraction (and lower energy) over non-radiative recombination in the larger AlN mole fraction matrix.

In particular, the present invention provides methods for producing UV light emitting devices containing the $Al_xGa_{1-x}N$ alloy composition described above as the active region layer. Such methods of producing these devices, in general, may involve, when using a sapphire substrate, deposition of a plurality of films sequentially on the substrate using a process comprising nitridation, high temperature AlN buffer deposition, prior to the epilayer growth of the AlGaN active region and band-edge layers. In particular, PA-MBE may be used.

The active region and band-edge layers may be deposited in various orders. Importantly, the method of the present invention allows creation of localized inhomogeneities in the AlGaN active region layer that contain nanometer-scale areas having larger or smaller AlN mole fraction than the entire composition on average by the growth of the film under a facetted or three-dimensional growth mode. This growth mode is achieved while growing under conditions where the growth rate of the film is determined by the arrival rate of active nitrogen (N-limited).

Further, this growth mode is achieved by growing under nearly stoichiometric conditions where the ratio of the arrival rate of group-III atoms (Al, Ga) and the arrival rate of active nitrogen is about unity. Moreover, the nanometer scale compositional inhomogeneities are self-assembled within the film as a result of the growth mode. The present process/method that results in the growth mode for producing a film comprised of an $Al_xGa_{1-x}N$ alloy, utilizable as an active region layer of a UV light emitting device, is defined by the following process factors:

1. Substrate temperature
2. Group-III atom flux (Al and Ga)
3. N atom flux/Growth Rate
4. Doping concentration Substrate Temperature The present inventors have investigated a large range of substrate temperatures, and have discovered that the optimum substrate temperature range for formation of nanoscale compositional inhomogeneities in AlGaN(NCI—AlGaN) in films deposited by the method of the present invention is between 770 to 950° C., as measured by the substrate thermocouple. Preferably, a substrate temperature of about 880 to 900° C. is maintained.

N Atom Flux/Growth Rate

Films deposited by the process/method of the present invention are grown under N-limited conditions, wherein the growth rate of the AlGaN film is dependent upon the arrival rate of active nitrogen on the substrate. The arrival rate of nitrogen in the present method is dependent upon the RF plasma power and the flow rate of $N_2$ gas employed.

The present inventors have deposited NCI—AlGaN at a growth rate of as high as 220 nm/hr, which corresponds, in their reactor, to a RF plasma power of about 300 W, and a $N_2$ gas flow rate of about 0.6 sccm (standard cubic centimeters per minute). This is equivalent to an effective nitrogen flux of 0.09 to 0.238 monolayers/sec. However, NCI—AlGaN may be deposited at a growth rate of about 1000 nm/hr using an RF plasma source.

Group-III Atom Flux (Al and Ga)

The amount of total group-III flux for a given effective nitrogen flux is the most important growth parameter in promoting the formation of nanoscale compositional inhomogeneities in the $Al_xGa_{1-x}N$ alloys of the present invention. In the present invention, the total Al flux for a given effective nitrogen flux, to promote the formation of nanoscale compositional inhomogeneities in the $Al_xGa_{1-x}N$ alloys, is from $1\times10^{-8}$ to $2\times10^{-7}$ Torr, as measured by beam equivalent pressure. The total Ga flux, as measured by beam equivalent pressure, is from $2\times10^{-7}$ to $2\times10^{-6}$ Torr. In a preferred embodiment of the invention, the Al atom flux, as measured by beam equivalent pressure employed, is from $1\times10^{-8}$ to $4\times10^{-8}$ Torr, and the Ga atom flux, as measured by beam equivalent pressure, is from $2\times10^{-7}$ to $7\times10^{-7}$ Torr.

Figure 13:
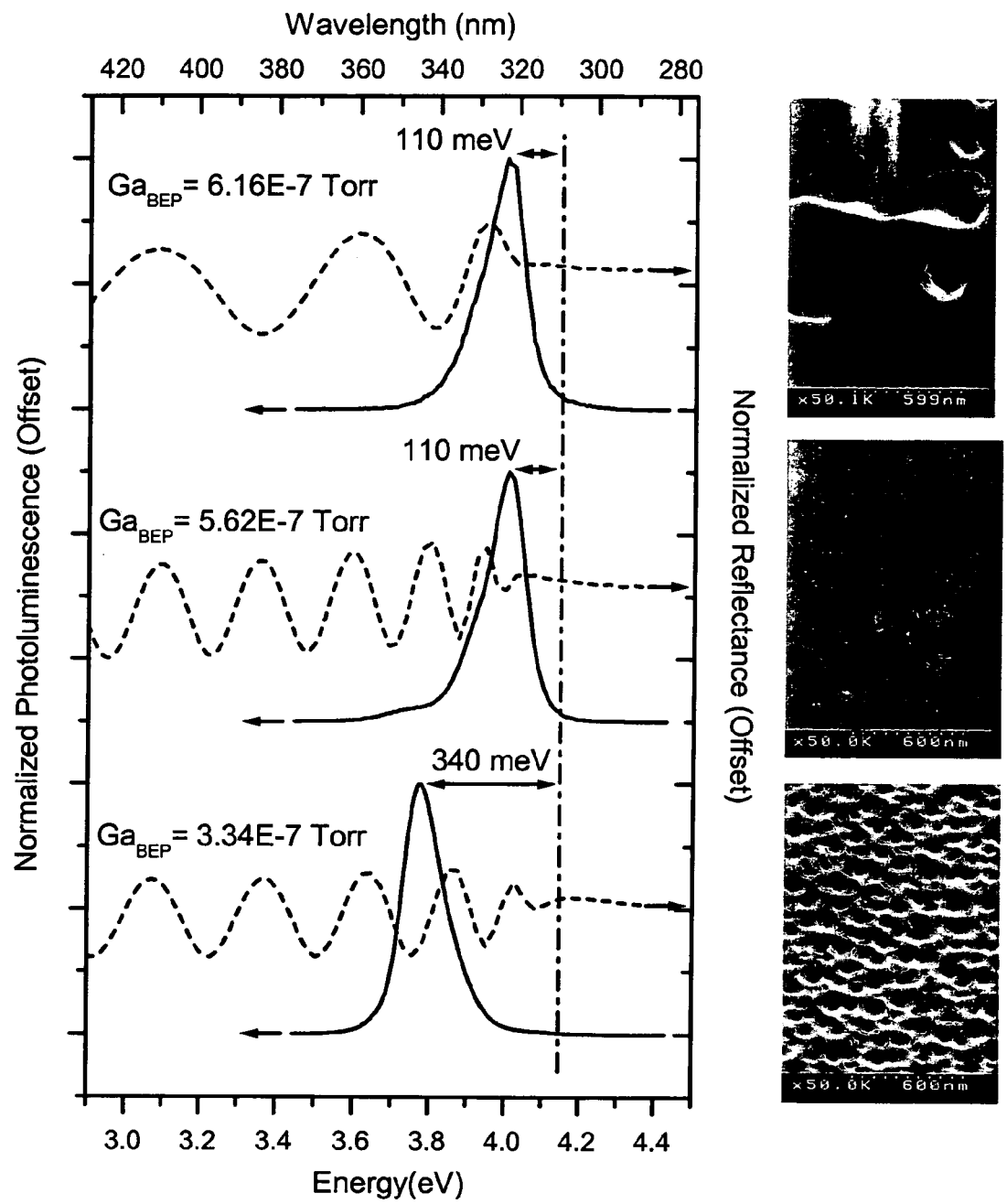
FIG. 13 is a graphical illustration of reflectivity, photoluminescence and corresponding digital representation of the surface morphology (obtained by a SEM) for each of three $Al_xGa_{1-x}N$ alloys, all containing ~33% AlN by mole fraction. Digital representations of the surface morphology of each respective film are shown to the right of the reflectance and photoluminescence data thereof in the graphical illustration.

FIG. 13 graphically illustrates reflectivity, photoluminescence and scanning electron microscopy (SEM) data for three $Al_xGa_{1-x}N$ alloys of the present invention (the SEM photos of each film shown to the right of the reflectance and photoluminescence data therefor in the graph), all containing ~33% AlN by mole fraction. The Al and Ga atom flux for this process/method is given as beam equivalent pressure that is directly proportional to the atom flux and is directly measurable inside the reactor. All of the films were deposited at a constant substrate temperature of about 880° C. and with equivalent Al atom flux of about $1.4\times10^{-8}$ Torr as measured by beam equivalent pressure, as well as an active nitrogen flux of about 0.09 monolayers/sec (250 W RF power, 0.25 sccm flow rate).

As illustrated in FIG. 13, the photoluminescence observed for the AlGaN alloys deposited at the Ga atom fluxes greater than about $5.6\times10^{-7}$ Torr, as measured by beam equivalent pressure, is dominated by near band edge emission, which is typical of what is generally observed for these alloys and which we refer to as "band-edge AlGaN". The surface morphology of these films is smooth, with the film deposited at the highest BEP (beam equivalent pressure), shown at the top of FIG. 13, showing evidence of metal droplet formation.

Figure 14:
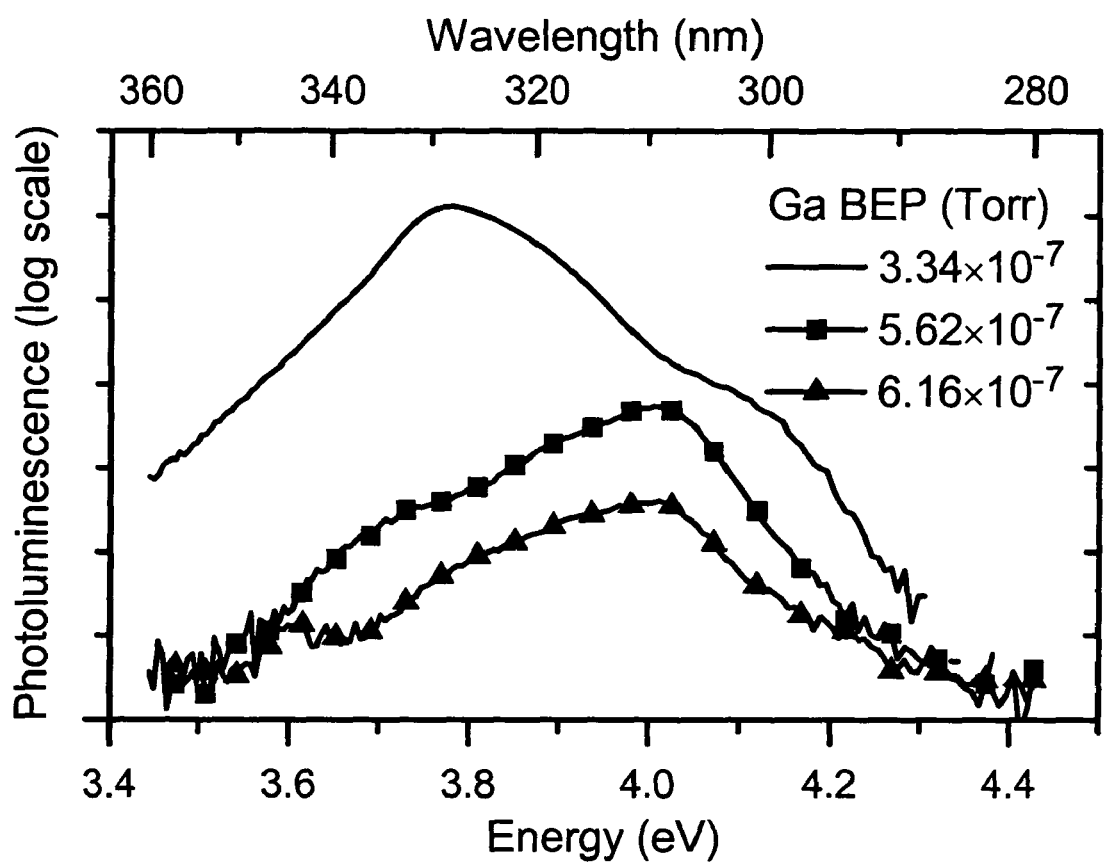
FIG. 14 is a graph illustrating the observed room temperature photoluminescence spectra for four AlGaN films of the present invention, deposited at varying levels of Ga atom flux.

In contrast, the photoluminescence peak of the AlGaN alloy film deposited with the lowest Ga atom flux, as measured by beam equivalent pressure, of about $3.34\times10^{-7}$ Torr is at a significantly lower energy than the band gap of the film (as great as 400 meV) and displays a luminescence significant intensity enhancement (~1000×) as shown in FIG. 14. The surface of such AlGaN alloy film, as illustrated at the bottom of FIG. 13, is characterized by a facetted morphology consisting of small pits having diameters of smaller than about 60 nm. The present inventors have grown such NCI—AlGaN alloys utilizing a Ga atom flux of between $2.00\times10^{-7}$ and $7\times10^{-7}$ Torr (as measured by beam equivalent pressure).

Figure 15:
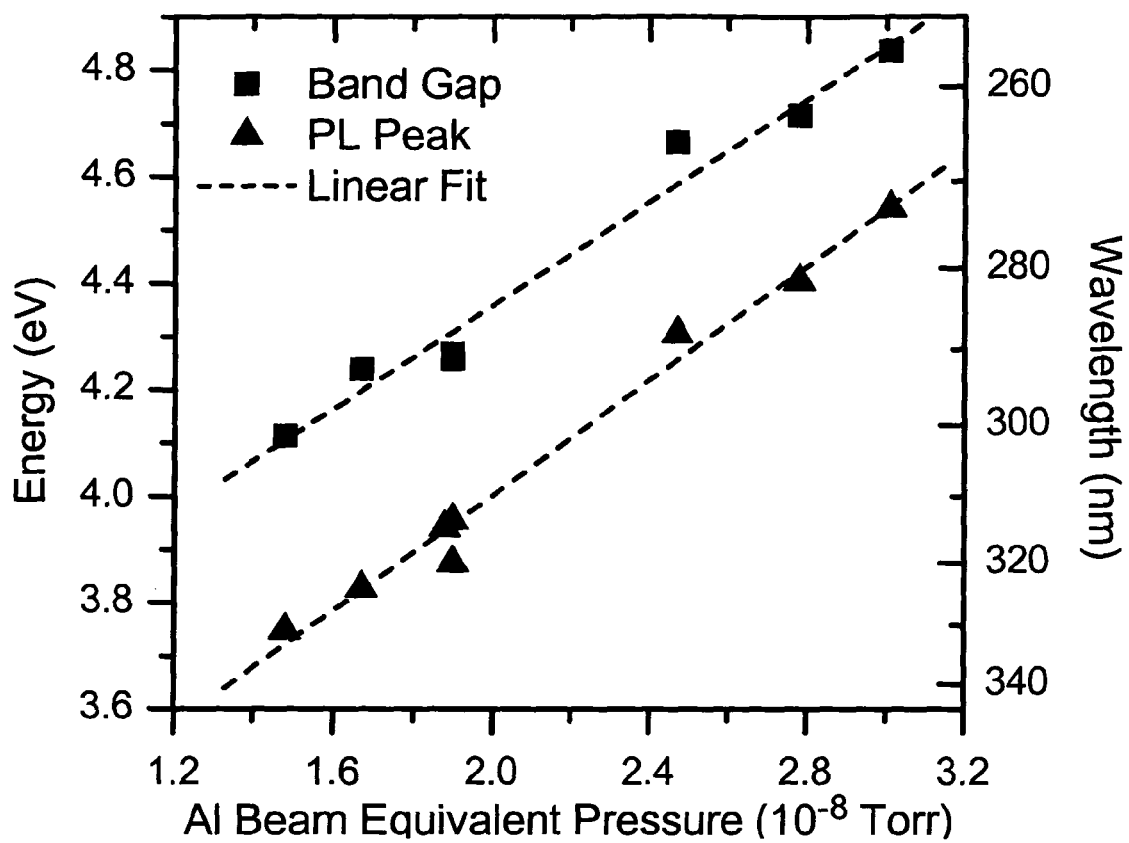
FIG. 15 is a graph of luminescence emission wavelength and alloy band gap energy for NCI AlGaN alloys of the present invention having AlN mole fractions of from 27 to 60% as a function of Al atom flux (as measured by beam equivalent pressure).

The AlN mole fraction of the NCI—AlGaN alloy and therefore the average AlN mole fraction of the film can be varied by changing the Al atom flux employed during growth. FIG. 15 illustrates the emission wavelength and corresponding band gap energy for such NCI AlGaN alloys of the present invention having AlN mole fractions of from 27 to 60% as a function of Al atom flux (as measured by Al BEP). The Ga atom flux must also be appropriately adjusted, so that approximately stoichiometric growth conditions are obtained, insuring an optimal result. An energy-shift greater than 250 meV and corresponding enhanced luminescence efficiency has been observed throughout this compositional range.

NCI (nanoscale compositionally inhomogeneous) AlGaN alloys (i.e., a group III-Nitride containing AlGaN alloy having nanometer-scale localized compositionally inhomogeneous regions therein) having an AlN mole fraction of between about 20 to 80% can be obtained using the present method. Varying the composition of the matrix of the AlGaN alloy during the deposition process described above allows tuning of the wavelength of the luminescence emission of the device, as desired, as shown in FIG. 15. The inventors have demonstrated tunability within the wavelength region of from 255 to 340 nm. All of the AlGaN active region layer alloys grown using the present method exhibit enhanced luminescence efficiency through carrier localization, without the use of indium.

Doping Concentration

Figure 16:
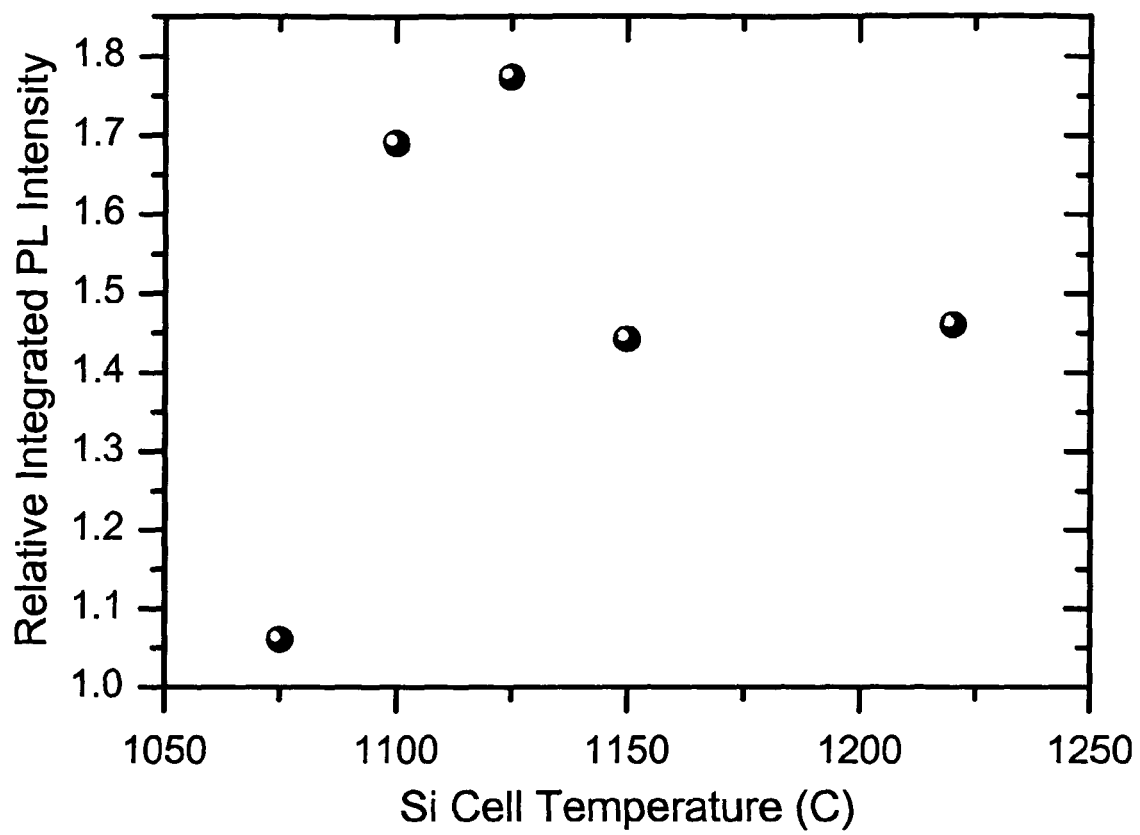
FIG. 16 is a graph of relative integrated PL intensity vs. Si cell temperature for an AlGaN alloy of the present invention containing 33% AlN by mole fraction.

The present inventors investigated the doping of NCI AlGaN with silicon (Si) to determine the effect thereof. As illustrated in FIG. 16, at Si concentrations of up to $10^{19}$ atoms/cm$^3$, relative integrated photoluminescence intensity is increased by doping of the AlGaN layer with silicon. In particular, it was unexpectedly discovered that greater enhancement of the photoluminescence can be obtained by doping with Si, with an impurity concentration of about $2\times10^{17}$ atoms/cm$^3$ having been found preferable for an alloy containing 33% AlN by mole fraction.

The $Al_xGa_{1-x}N$ alloy thin films of the present invention are preferably deposited by plasma-assisted molecular beam epitaxy (PA-MBE) using, for example, a VARIAN™ Genii MBE reactor. This reactor has three zones commonly referred to as the entry chamber, the preparation chamber, and the growth chamber, all being maintained at ultra-high vacuum (<$10^{-9}$ Torr) to provide a clean environment for semiconductor crystal growth. The entry chamber and preparation chamber are used for in-situ cleaning of the substrate upon which the AlGaN epilayer is to be grown. The $Al_xGa_{1-x}N$ thin films are deposited in the growth chamber, equipped with effusion cells, for the evaporation of the group-III constituents, gallium (Ga) and aluminum (Al), as well as the n-type dopant, silicon (Si). The arrival rate of these atoms at the substrate is controlled by regulating the temperature of the effusion source, and monitored by measuring the atom beam equivalent pressure (BEP). A radio frequency (RF) plasma source is employed to turn nitrogen gas ($N_2$) into active nitrogen. The arrival rate of these nitrogen species on the substrate is controlled by adjusting the RF power of the plasma and the gas flow rate.

In the film deposition processes of the present method, flow rates and RF plasma powers are adjusted to achieve the conditions of the present method as set forth above. For example, a flow rate of about 0.25 sccm and a RF plasma power of about 250 W may be employed. High purity elemental source materials for Ga, Al and Si (99.9999% or better), as well as high purity $N_2$ gas (99.9995%), are preferably utilized in the process of the present invention, so as to reduce the incorporation of undesirable impurities.

This invention is shown by way of example.

Example 1

A DH (double heterostructure) UV-LED was fabricated according to the present method, using PA-MBE as described above. In particular, a n-type AlGaN current spreading layer having an AlN mole fraction of about 40% and a thickness of approximately 50 nm was deposited upon an AlGaN template. This n-type AlGaN current spreading layer was deposited under nitrogen limited conditions at a growth rate of about 220 nm/hr using nitrogen plasma conditions of about 300 W rf power and about 0.6 sccm $N_2$ gas flow rate. The substrate temperature employed was about 891° C., and the Al and Ga atom flux (as measured by BEP) were approximately $5.14\times10^{-8}$ and $2.07\times10^{-7}$ Torr respectively. The layer was intentionally doped n-type by incorporating about $1\times10^{19}$ atoms/cm$^3$ of silicon into the film by employing a Si effusion cell temperature of 1220° C.

Subsequently, an active region layer was deposited on top of the n-type AlGaN current spreading layer under nearly stoichiometeric and nitrogen limited conditions, so as to encourage the formation of a facetted surface morphology of the active region layer during growth, as called for by the present invention. The active region layer consists of an AlGaN alloy having nanometer scale compositional inhomogenieites and having an average AlN mole fraction of about 33%. In particular, a growth rate of about 80 nm/hr was employed using nitrogen plasma conditions of about 250 W rf power and about 0.25 sccm $N_2$ gas flow rate. The substrate temperature employed was about 899.7° C., and the Al and Ga atom flux (as measured by beam equivalent pressure) were approximately $1.87\times10^{-8}$ and $4.24\times10^{-7}$ Torr, respectively. The layer was intentionally doped n-type by incorporating about $2\times10^{17}$ atoms/cm$^3$ of silicon into the film by employing a Si effusion cell temperature of 1100° C. Thereafter, the heterostructure wafer was then cooled to 20° C. at a rate of about 3° C./min and subsequently removed from reactor. Next, the active region layer was examined by photoluminescence studies prior to the wafer being sent to a commercial partner for the deposition of a p-type AlGaN blocking layer having an AlN mole fraction about 40% and a p-GaN layer using proprietary processes to complete the DH-UVLED structure as described in the tenth embodiment of the present invention.

Figure 17A:
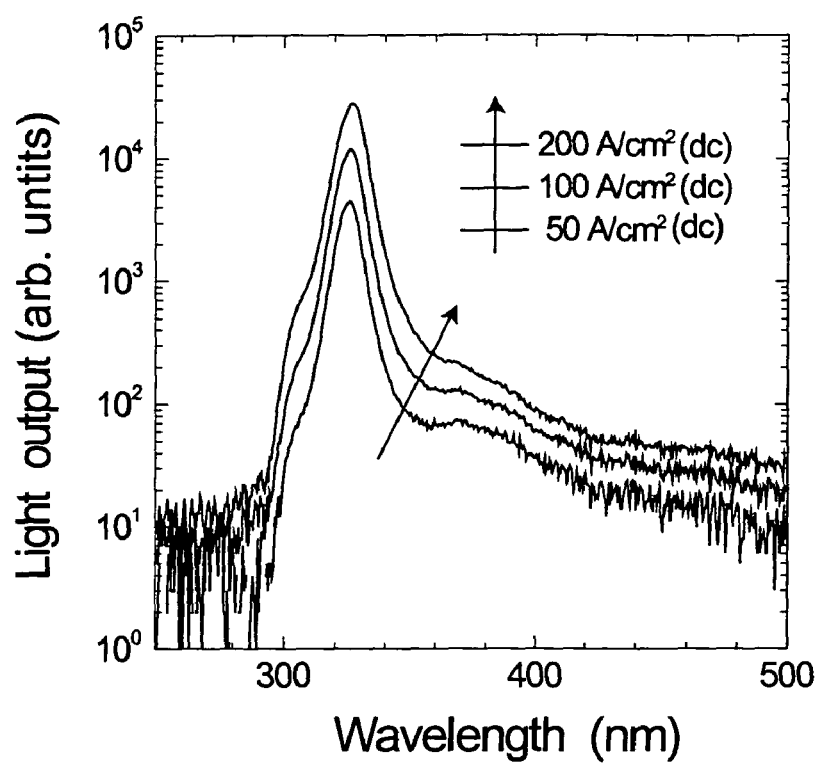
FIG. 17(a) is a graphical illustration of the measured electroluminescence spectra (intensity vs. emission wavelength) of two DH-LEDs of the present invention utilizing an AlGaN template.
Figure 17:
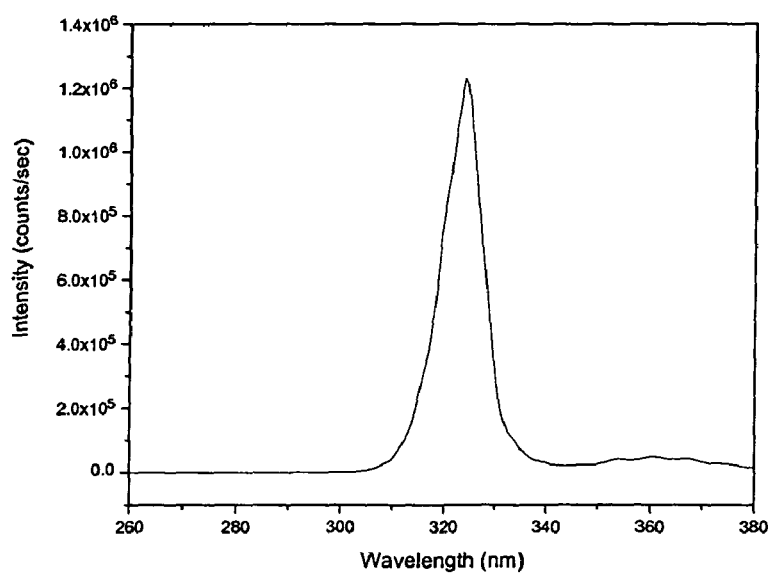
FIG. 17(b) is graphical illustration of the photoluminescence spectra (intensity vs. emission wavelength) of the NCI AlGaN active region layer that was incorporated into the DH-UV LEDs whose electroluminescence is presented in FIG. 17 (a).

DH UV LED's designed for electrical injection were fabricated utilizing this material by our commercial partner using proprietary processes. Devices having areas of 100× 100 and 200×200 μm$^2$ were fabricated, and their measured electroluminescence spectra are shown in FIG. 17 (a). These devices were observed to have a peak emission wavelength of about 326 nm, which is consistent with the photoluminescence measurements performed prior to completion of the DH-UVLED structure (FIG. 17(b)), and is evidence that the electroluminescence originates from the NCI active region layer of the present invention.

Figure 18:
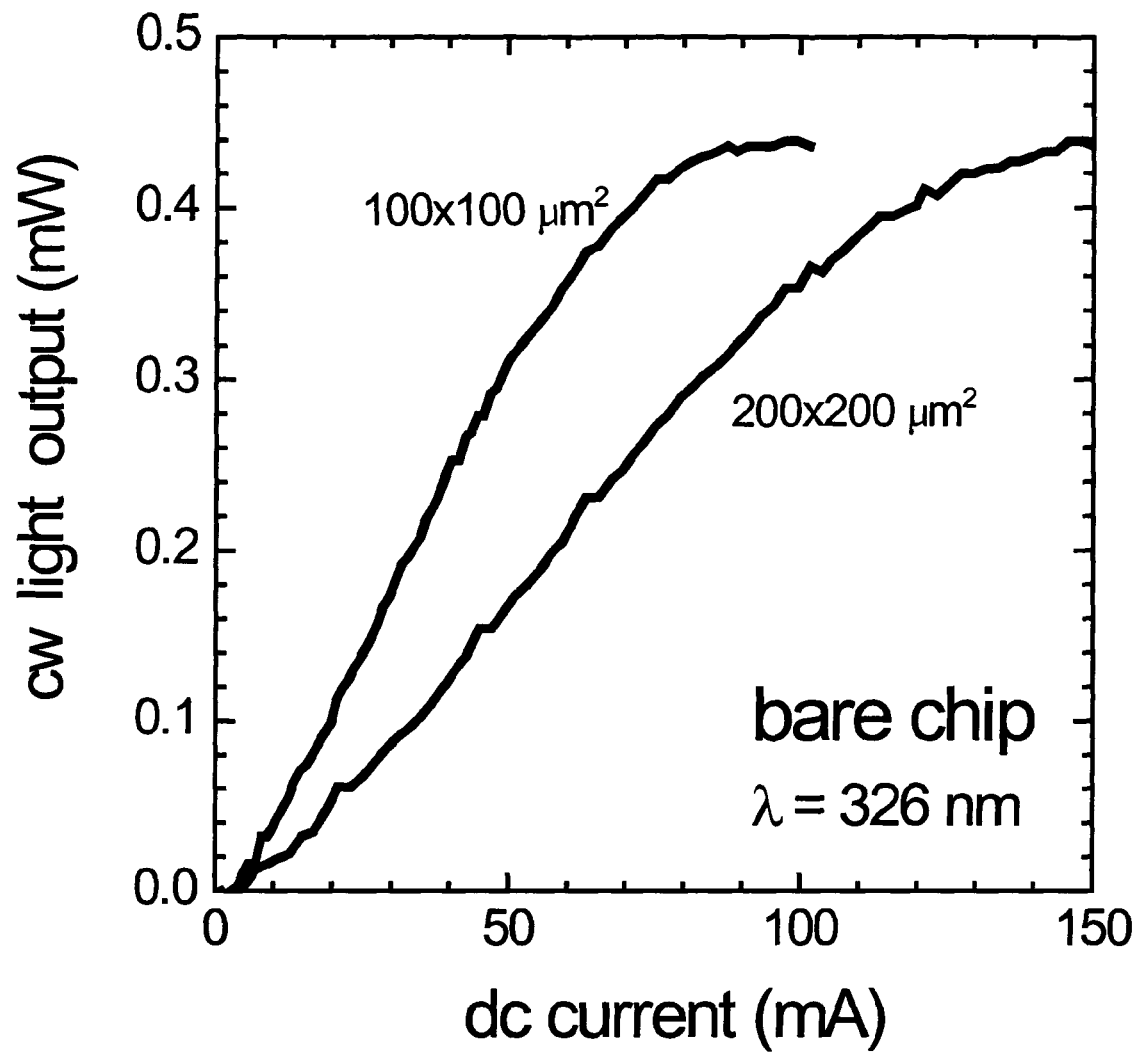
FIG. 18 is a graphical illustration of the measured light output as function of DC drive current for an NCI—AlGaN DH-UV LED of the present invention, operating at 326 nm.

Standard electroluminescence intensity vs. DC drive current measurements were performed on these devices and their results are shown in FIG. 18. It was observed that the smaller device (having an area of 100×100 μm$^2$) had an optical power output of 0.45 mW at 80 mA DC drive current. It should be noted that the data was measured by examining an unpackaged chip, and thus the power output may be understated.

Example 2

A DH (double heterostructure) UV-LED was fabricated according to the present method, using PA-MBE and utilizing a sapphire substrate as described above. First, the substrate was nitridated by heating to a temperature 831.6° C., and then the surface of the substrate was exposed to the nitrogen plasma source for 10 mins. The plasma source conditions for this step were 300 W rf power and 0.6 sccm. Thereafter, an AlN buffer layer, with an approximate thickness of 25 nm, was deposited atop the nitridated substrate utilizing an Al atom flux (as measured by BEP) of about $5.02\times10^{-8}$ Torr and a growth rate of 220 nm/hr. The substrate temperature and nitrogen plasma conditions for this step were identical to that of the nitridation step.

Subsequently a n-type AlGaN current spreading layer having an AlN mole fraction of about 40% and thickness of about 1800 nm was deposited under nitrogen-limited conditions using a substrate temperature, growth rate and plasma source condition identical to the AlN buffer layer step. The Al and Ga atom flux (as measured by BEP) employed during this step were approximately $1.87\times10^{-8}$ and $4.24\times10^{-7}$ Torr, respectively. The layer was intentionally doped n-type by incorporating about $1\times10^{19}$ atoms/cm$^3$ of silicon into the film by employing a Si effusion cell temperature of 1220° C.

Subsequently, an active region was deposited under nearly stoichiometric and nitrogen limited conditions so as to encourage a facetted surface morphology during growth, as called for by the present invention. The active region layer consisted of an AlGaN alloy having nanometer scale compositional inhomogeneities, and having an average AlN mole fraction of about 33%. This active region layer was approximately 50 nm thick, and deposited at a growth rate of about 80 nm/hr.

The nitrogen plasma conditions employed consisted of a 250 W rf power and about 0.25 sccm $N_2$ gas flow rate. The substrate temperature employed was about 876.1° C. and the Al and Ga atom flux (as measured by BEP) were approximately $1.89\times10^{-8}$ and $6.17\times10^{-7}$ Torr, respectively. The active region layer was intentionally doped n-type by incorporating about $2\times10^{17}$ atoms/cm$^3$ of silicon into the film by employing a Si effusion cell temperature of 1100° C.

As a next step, an electron blocking layer, consisting of 10 nm of AlGaN and having an AlN mole fraction of about 40%, was deposited under identical conditions to that of the n-type AlGaN current spreading layer, with one notable exception. The electron blocking layer was doped with magnesium instead of silicon, using a Mg atom flux (as measured by BEP) of $6.82\times10^{-8}$ Torr. Finally, a 220 nm thick p-type GaN layer was deposited under nitrogen limited conditions at a substrate temperature of 831.6° C., a Ga atom flux (as measured by BEP) of $6.75\times10^{-7}$ Torr and a Mg atom flux (as measured by BEP) of $6.82\times10^{-8}$ Torr. The growth rate and plasma source conditions employed were identical to those used for the deposition of the n-AlGaN current spreading layer. The DH UVLED structure was then cooled to 20° C. at a rate of about 3° C./min.

Figure 19:
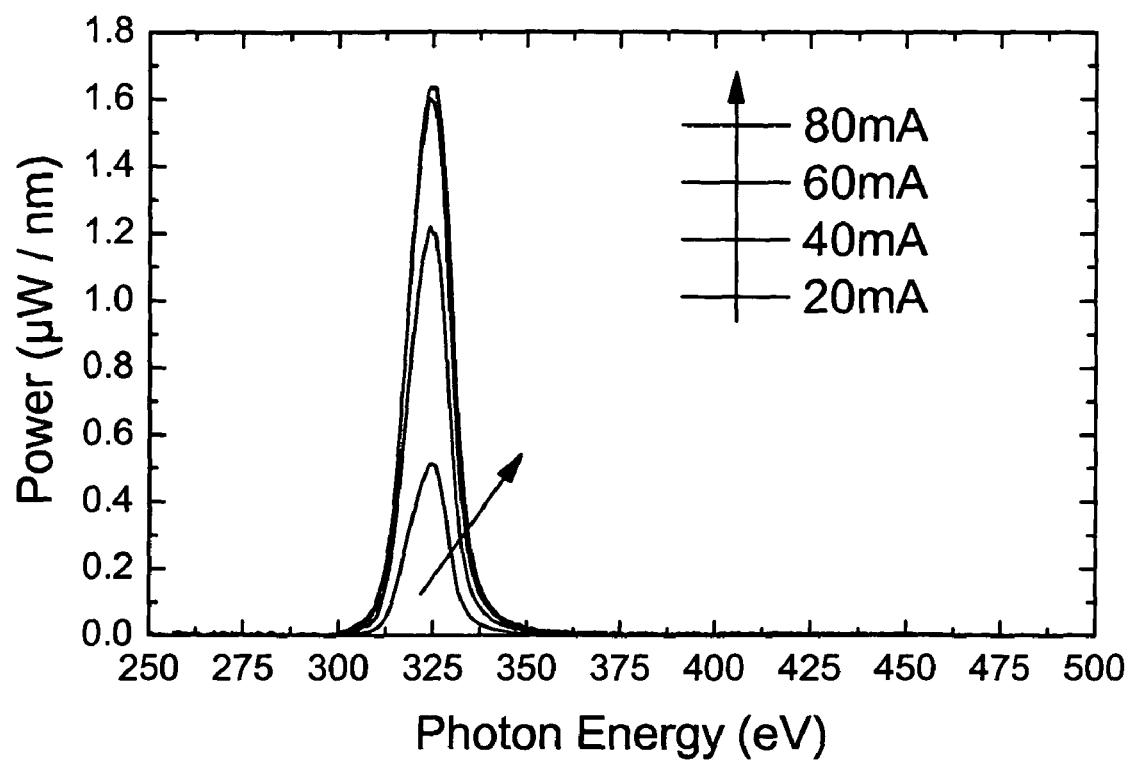
FIG. 19 is a graphical illustration of the measured electroluminescence spectra (intensity vs. emission wavelength) of a DH-LEDs of the present invention utilizing a sapphire substrate.
Figure 20:
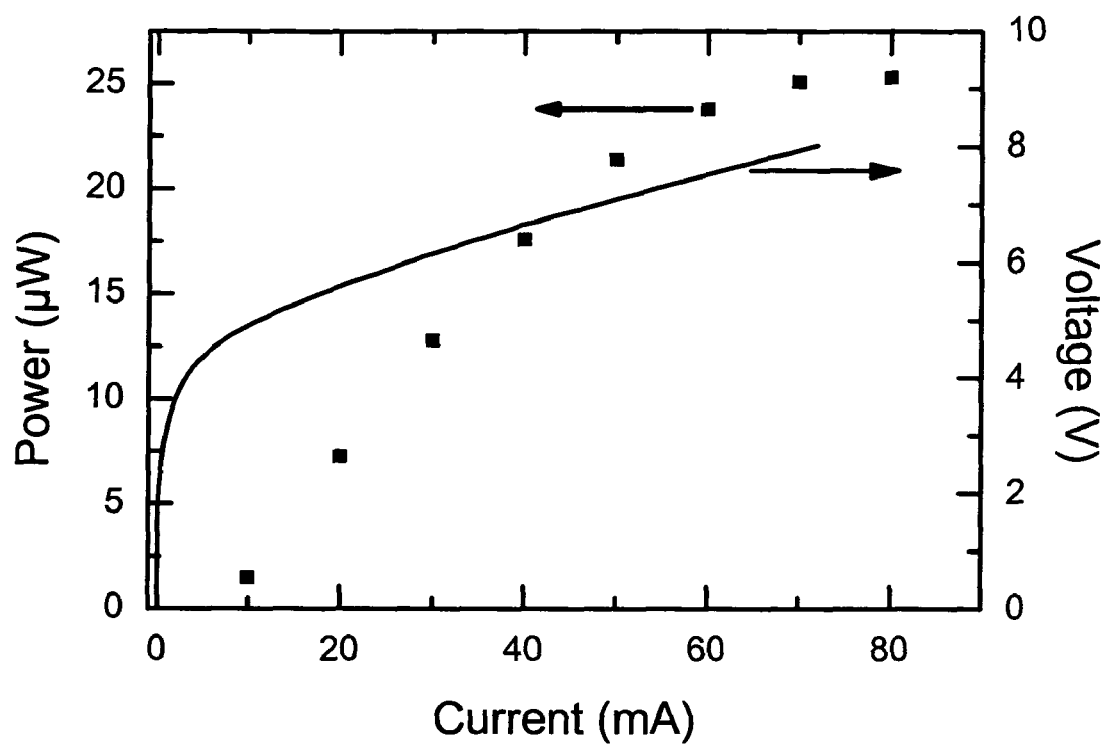
FIG. 20 is a graphical illustration of the measured light output as function of DC drive current for an NCI—AlGaN DH-UV LED of the present invention, operating at 325 nm.

The DH UV LEDs designed for electrical injection were fabricated by the inventors having an area of 1×1 mm$^2$. The measured electroluminescence from the fabricated devices was observed to peak at 325 nm as shown in FIG. 19. Standard electroluminescence intensity vs. DC drive current measurements were performed on these devices and their results are shown in FIG. 20. It was observed that these devices had an optical power output of 25 μW at 60 mA DC drive current. It should be noted that the data was measured by examining an unpackaged chip, and thus the power output may be understated.

Example 3

Figure 21:
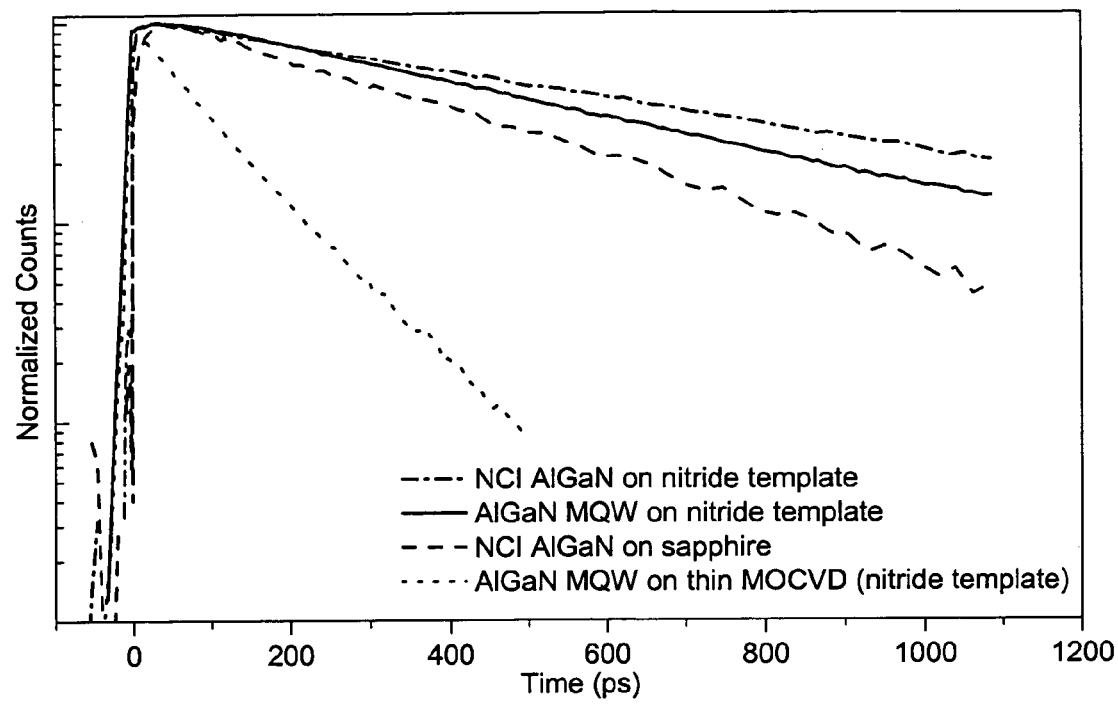
FIG. 21 is a graph comparing NCI—AlGaN active region layers deposited on nitride template and sapphire substrates versus conventional MQW active region layers deposited on nitride template and sapphire using time resolve photoluminescence studies (TRPL).

FIG. 21 shows a comparison of the photoluminescence lifetime in NCI AlGaN active region layers of present invention versus conventional AlGaN MQW (multiple quantum well) active region layers, deposited on both sapphire and a nitride semiconductor template. The conventional AlGaN MQW active region layers were designed for emission at 330 to 340 nm. They were deposited on a thin GaN template (buffer) on sapphire, and on a thick GaN HVPE free-standing substrate. The defect densities for the thin GaN template and the thick GaN substrate were estimated from etch pit counting by atomic force microscopy (AFM) to be ~$10^9$ cm$^{-2}$ and $10^7$ cm$^{-2}$, respectively.

It was found that the PL lifetime in the AlGaN MQW on the thin GaN template is about 100 ps, while for the AlGaN MQW on the thick GaN substrate the PL lifetime increases to about 500 ps (see G. A. Garrett, C. J. Collins, A. V. Sampath, H. Shen, M. Wraback, S. F. LeBoeuf, J. Flynn, and G. Brandes, *Phys. Stat. Sol.(c)* Vol. 2, No. 7, pp. 2332-2336 (2005), incorporated by reference in its entirety herein). FIG. 21 clearly shows that the NCI AlGaN active region layer of the present invention on sapphire has a much longer PL lifetime (about 400 ps) than its conventional AlGaN MQW counterpart on the thin GaN template, despite having about two orders of magnitude higher defect density.

FIG. 21 further clearly shows that the NCI AlGaN active region layer on an AlGaN template, with a defect density greater than $10^9$ cm$^{-2}$, has a significantly longer PL lifetime (about 700 ps) than the conventional AlGaN MQW active region layer deposited on a GaN template with more than two orders of magnitude lower defect density. Since PL lifetime is directly related to radiative efficiency in these cases, these results provide further proof of the vastly improved radiative efficiency of the NCI AlGaN of the present invention over that of conventional AlGaN MQWs, despite a higher density of defects associated with nonradiative channels in the NCI AlGaN.

Example 4

Preparation

The deposition of high quality III-Nitride materials by the PA-MBE process requires proper preparation of the substrate surface immediately prior to growth to remove contamination that would otherwise degrade the quality of the epitaxial layer. These preparation techniques consist of both in-situ (within the MBE reactor) and ex-situ (outside the MBE reactor) steps meant to condition the surface of the substrate. A 2 inch diameter, single side polished, substrate was prepared ex-situ by first evaporating an approximately 2 micron thick titanium film on the back-side of the substrate by sputter deposition. Subsequently, this titanium film was capped with an approximately 1 micron thick silicon dioxide film deposited by plasma enhanced chemical vapor deposition (PECVD). The 2 inch diameter substrate was then cut into 4 similar size pieces using a dicing saw equipped with a diamond blade.

These 4 smaller sized substrates were chemically prepared by solvent degreasing in acetone, methanol, and finally 2-propanol, for about 20 minutes each. Next, the substrates were rinsed with deionized water (DI-H$_2$O), and then immersed in a boiling 3:1 hydrochloric acid to nitric acid solution for about 10 minutes. The protective PECVD-deposited oxide cap previously formed on the titanium cap was then removed by immersing each substrate in 6:1 buffer oxide etchant. The substrates were then rinsed again in DI-H$_2$O for 30 minutes prior to mounting on a substrate holder. The samples were mounted into standard 3 inch VARIAN™ molybdenum blocks using an Applied EPI™ uni-block sample holder system that allows for radiatively heating the substrates.

The substrate samples were then prepared in-situ in a process comprising annealing the substrates in the entry chamber of the reactor at 300° C. overnight, and then further annealing the substrate samples in the preparation chamber of the reactor at 600° C. for 6 hours before the active region layer deposition process began. For substrates consisting of a III-Nitride film or a III-Nitride film deposited upon a substrate, also referred to as a III-Nitride template, an additional step is performed inside the growth chamber of the reactor than consists of annealing the substrate at a temperature between 700-900° C. for about 1.5 hours while periodically exposing the surface to a Ga atom flux for about 2 minutes over a 12 minute period so as to cover the substrate surface with metal.

Evaluation of Algan Alloy Active Region Layer Compositions of the Present Invention:

Room temperature photoluminescence (PL) measurements of devices according to the present invention were performed using a continuous wave 244 nm Ar laser with an excitation power of between 0.4 to 20 mW. Low temperature PL measurements were performed at a temperature of between 10 K and 300 K, by placing samples of the devices of the present invention in a He compressor-cooled cryostat. The band gap energy of the films was determined by simulation of reflectivity spectra data obtained by measuring same between 200 and 600 nm using a Perkin Elmer Lambda 16 UV/VIS/NIR spectrometer, and were confirmed by photoreflectance measurements.

The luminescence lifetime of the films was measured by time-resolved photoluminescence (TRPL) measurements taken of the samples for varying fluences (laser pump intensities) using sub-picosecond luminescence downconversion. The surface morphology of the films was investigated by scanning electron microscopy (SEM) using a field emission microscope and cathodoluminescence (CL).

Figure 22:
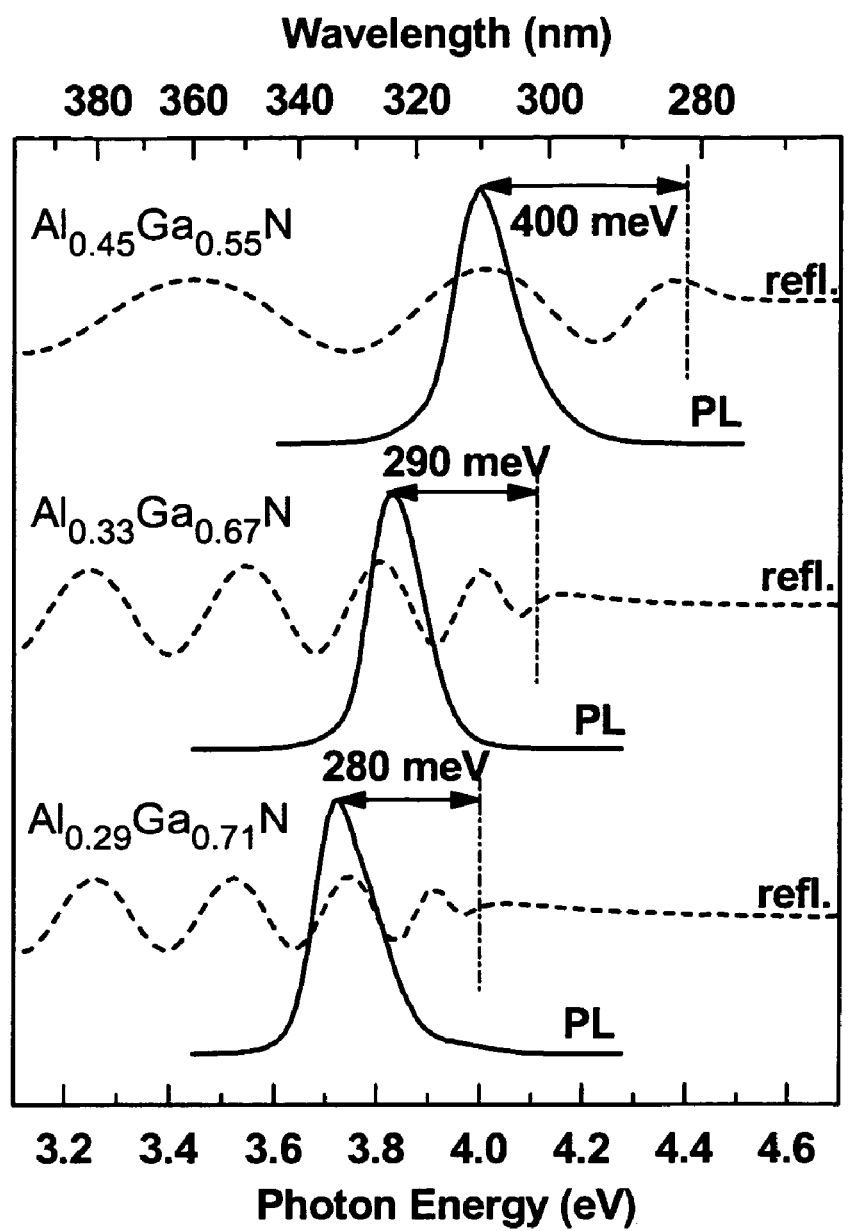
FIG. 22 is a graph comparing room-temperature PL data to reflectivity results for three different representative layers of $Al_xGa_{1-x}N$ thin films (i.e., $Al_{0.45}Ga_{0.55}N$, $Al_{0.33}Ga_{0.67}N$, and $Al_{0.29}Ga_{0.71}N$) prepared according to the present invention, deposited directly on sapphire substrates.

Enhanced Room Temperature Internal Quantum Efficiency in $Al_xGa_{1-x}N$ Alloys:

The process of the present invention, as described, above was utilized for depositing $Al_xGa_{1-x}N$ alloy thin films of the present invention directly on sapphire substrates to produce UV LEDs according to the present invention, and subsequent measurements of said devices were made as discussed above. For example, FIG. 22 illustrates a comparison of room-temperature photoluminescent (PL) data to reflectivity results for three different representative layers of such $Al_xGa_{1-x}N$ thin films (i.e., $Al_{0.45}Ga_{0.55}N$, $Al_{0.33}Ga_{0.67}N$, and $Al_{0.29}Ga_{0.71}N$, respectively) deposited using AlN buffer layers on sapphire substrates. The dashed vertical lines represent the approximate band edge, as determined by reflectivity and confirmed by photoreflectance measurements.

As clearly illustrated in FIG. 22, the PL peaks of the three $Al_xGa_{1-x}N$ thin films according to the present invention are significantly red-shifted with respect to the band edge. For these three epitaxial layers, with aluminum percentages of 29%, 33%, and 45%, respectively, the red shifts in PL from band edge are 280 meV, 290 meV, and 400 meV, respectively. FIG. 22 illustrates that, for bandgaps of the matrix material covering 4.1 eV to 4.8 eV through variation of the Al percentage, the red shift remains ~300 to 400 meV. FIG. 14 shows that the PL intensities of these AlGaN active region layers are orders of magnitude brighter than for films with similar defect densities and only band edge emission.

Figure 23:
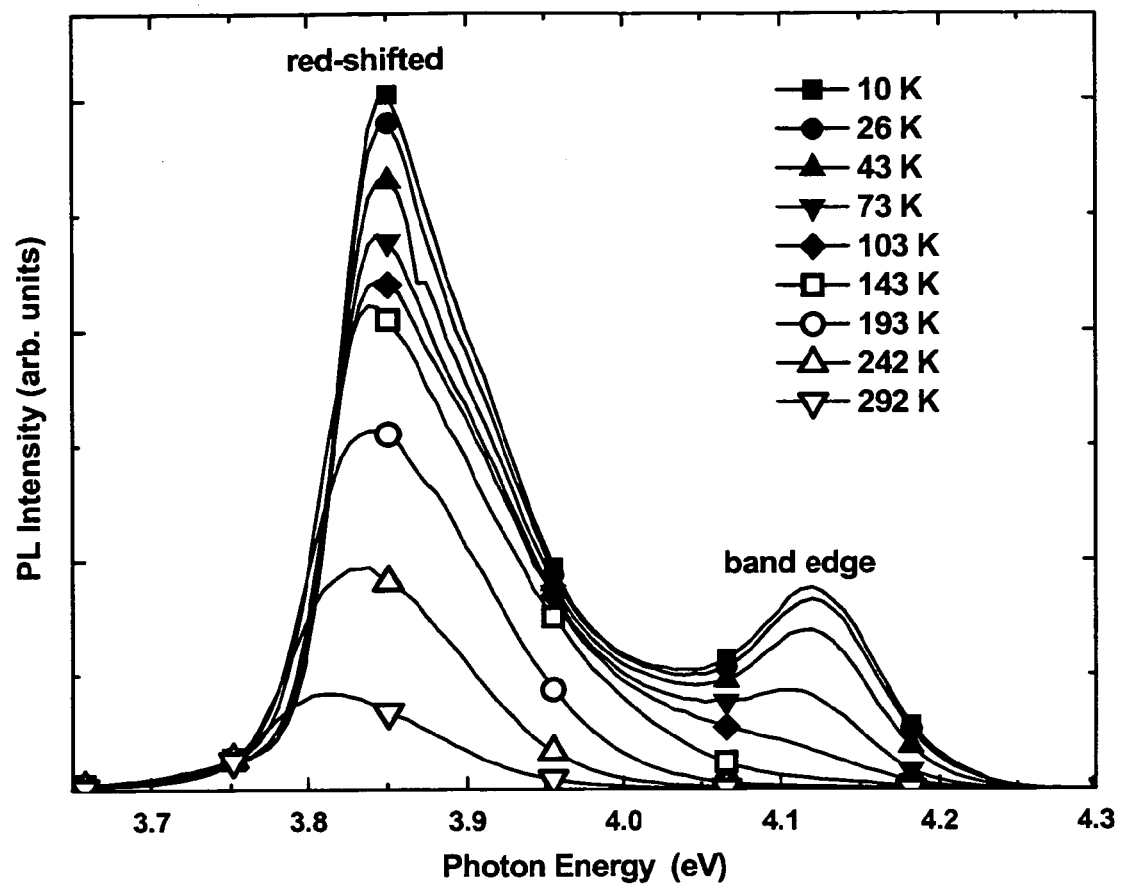
FIG. 23 is a graph illustrating the PL spectra of the $Al_{0.33}Ga_{0.67}N$ thin film sample shown in FIG. 22, at varying temperatures.

In particular, to further investigate this red-shift effect, PL spectra were taken from 10 K to 292 K on the $Al_{0.33}Ga_{0.67}N$ sample shown in FIG. 22, and the results thereof shown in FIG. 23. As illustrated therein, at low temperature (i.e., 10 K), there are two distinct PL peaks. The red-shifted (RS) peak (3.82 eV, 324.5 nm) shows very bright emission at 10 K that decreases by about a factor of seven as the temperature is increased from 10 to 292 K. The second smaller peak (4.11 eV, 301.5 nm), associated with band edge (BE) emission, is seen at low temperature but, as illustrated, its intensity rapidly decreased by greater than three orders of magnitude from 10 K to 292 K.

Room temperature monochromatic CL images, as shown in FIG. 5, of the $Al_{0.33}Ga_{0.67}N$ film shown in FIG. 23, acquired at the RS peak (3.82 eV, 324.5 nm), indicate that luminescence of the $Al_{0.33}Ga_{0.67}N$ film according to the present invention is spatially nonuniform (2.56×2.56 µm), with feature sizes as small as 100 nm in extent. This image is however limited in its resolution to the diffusion length of the excited carriers at room temperature, which implies that the actual size of these compositional inhomogeneities may be much smaller. This clearly indicates the presence of localized inhomogeneities, i.e., regions of the AlGaN film in which the AL is not uniformly incorporated therein. The BE peak has almost no measurable CL signal at room temperature.

The spatial inhomogeneity of the RS CL emission, as illustrated in FIG. 5, and the comparison of the temperature dependence of the band edge (BE) and RS PL peaks, as shown in FIG. 23, suggest both the transport of thermally activated-photogenerated carriers from the wider band gap AlGaN matrix into localized states characterized by the longer wavelength emission, as well as the suppression of nonradiative processes in these localized states.

Figure 24:
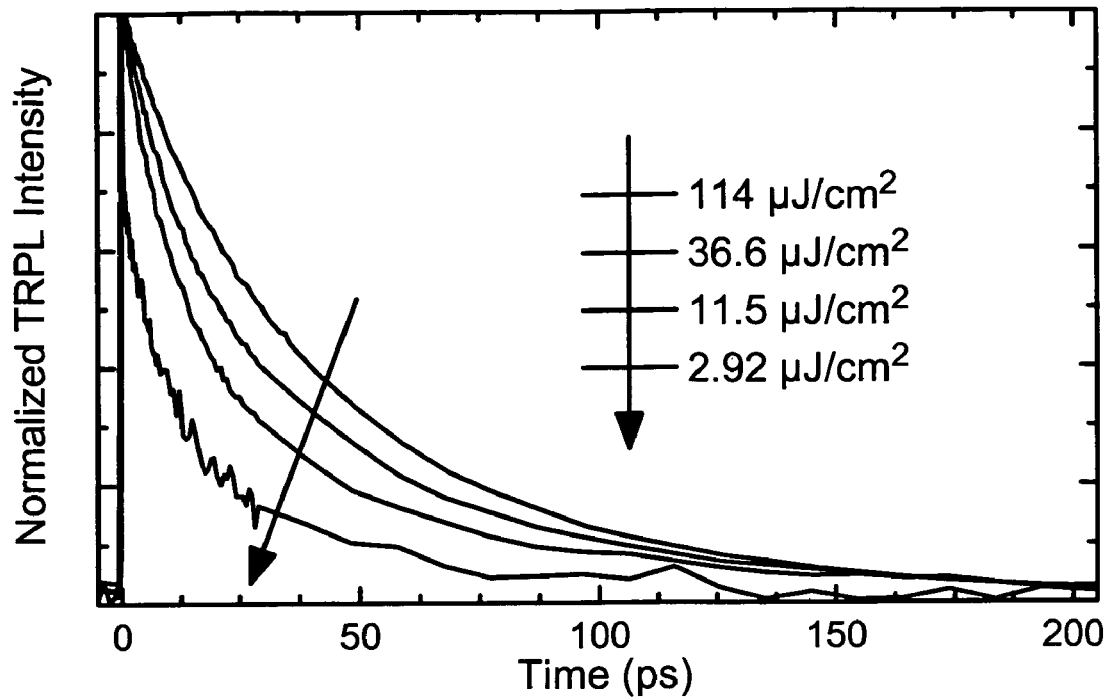
FIG. 24 is a graph illustrating the normalized TRPL measurements taken of the band edge photoluminescence (BE) in the $Al_{0.33}Ga_{0.67}N$ thin film sample shown in FIG. 22 at room temperature after excitation of said film with a 290-nm laser pump pulse at four different fluences.
Figure 25:
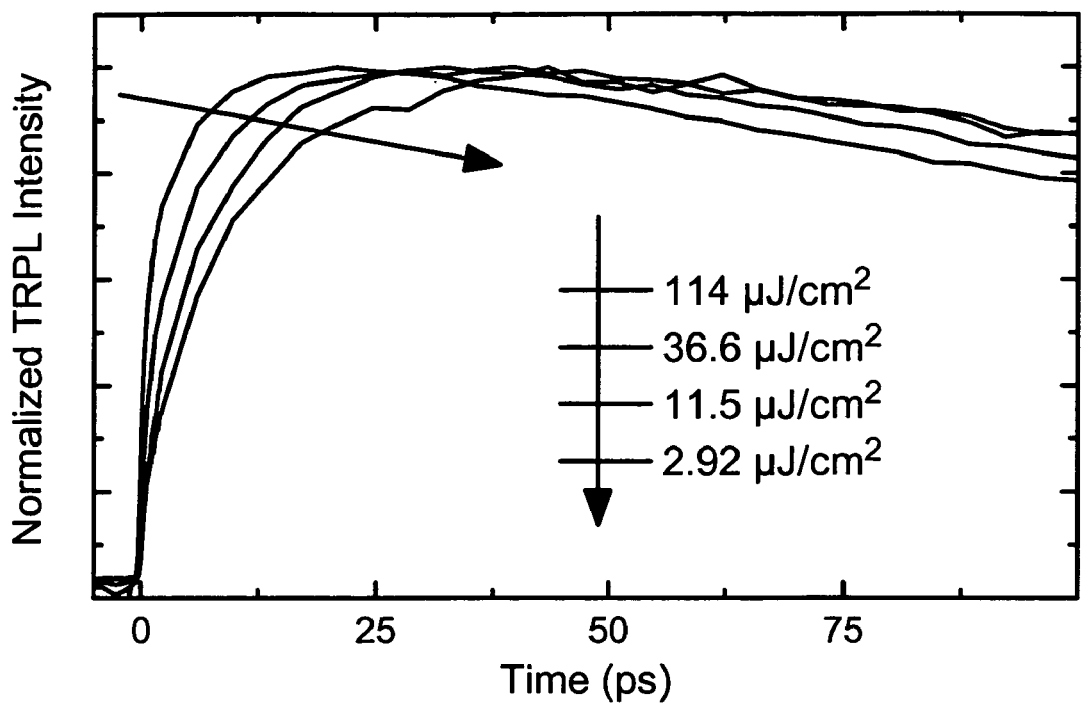
FIG. 25 is a graph illustrating the normalized TRPL measurements of the rise time of emission of the red-shifted photoluminescence (RS) in the $Al_{0.33}Ga_{0.67}N$ thin film sample produced according to the present invention at room temperature, after excitation of said film with a 290-nm laser pump pulse at four different fluences.
Figure 26:
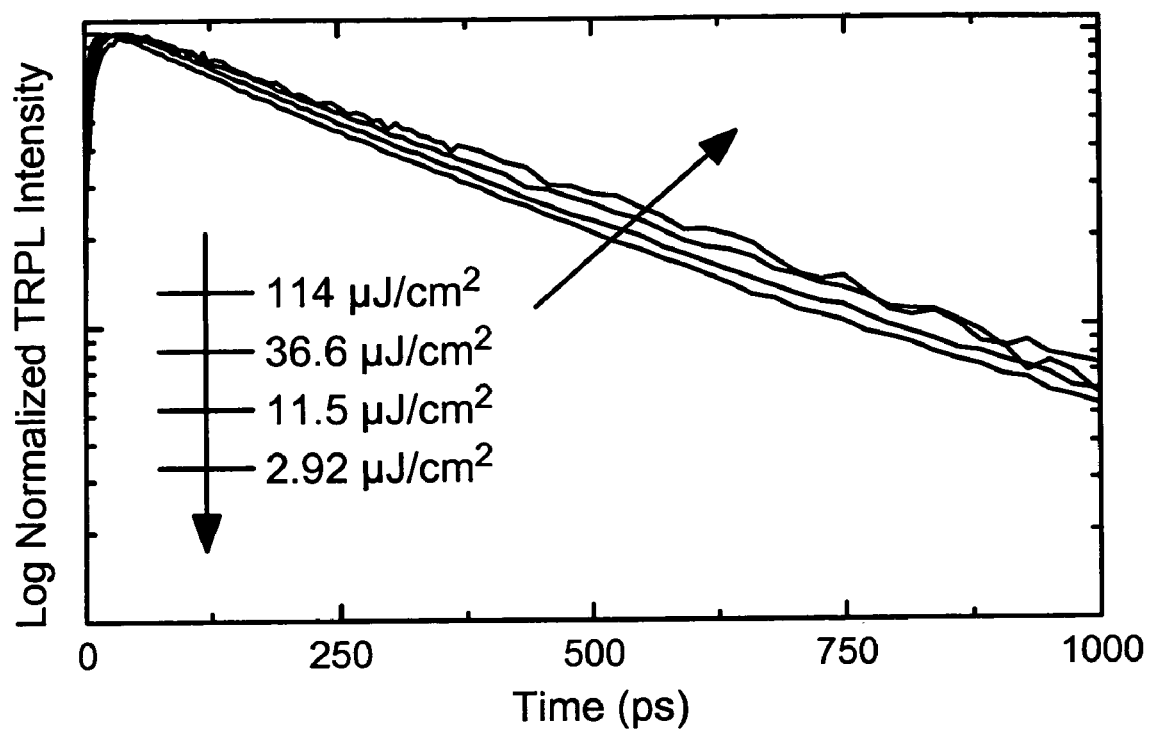
FIG. 26 is a graph illustrating the log of the normalized TRPL measurements taken at the red-shifted photoluminescence (RS) peak of a $Al_{0.33}Ga_{0.67}N$ thin film sample produced according to the present invention at room temperature, after excitation of said film with a 290-nm laser pump pulse at four different fluences.

Further evidence of this phenomenon can be seen from investigation of the differences in the two PL peaks shown in FIG. 23, using room temperature time-resolved PL (TRPL) measurements. FIGS. 24-26 illustrate the time evolution of the PL intensity measured at the BE peak and the RS peak as a function of fluence for a 290-nm fs laser pulse. As illustrated in FIG. 24, TRPL data for the BE peak shows a prompt response at t=0 and an intensity dependent decay that saturates at higher pump intensity. These decays are characterized by half-lives of from 5 to 30 ps for increasing pump intensities.

TRPL data for the RS peak, however, shows intensity dependent initial rise times with emission peaks at 44, 40, 31, and 21 ps, for increasing pump fluence as shown in FIG. 25. Moreover, the semilog plot illustrated in FIG. 26 shows that the RS peak data possesses nearly intensity independent decays that can be characterized by a fast (~245 ps) and a slow (~590 ps) component, giving a weighted average of ~375 ps.

The slower decay of the BE PL at increased pump fluence, as shown in FIG. 26, shows that carriers are quickly trapped in shallow localized states of the AlGaN active region layer that are saturable at high carrier densities (See M. Wraback, F. Semendy, H. Shen, U. Chowdhury, D. J. K. Lambert, M. M. Wong, and R. D. Dupuis, *Phys. Status Solidi A* 188, 807 (2001), which is incorporated herein by reference in its entirety). Further, the overall fast (<30 ps) decays of the BE PL are comparable to those obtained for other AlGaN alloys of similar defect density and Al content.

In contrast, localized states of conventional alloys are characterized by bandtails with 20 to 60 meV width for this Al concentration, as well as a large density of deep defect states. Although long lifetimes in bandtail states for conventional AlGaN alloys have been reported at temperatures low enough to effect freeze-out of most nonradiative processes, at room temperature the carriers localized in the bandtails of such conventional AlGaN alloys subsequently nonradiatively recombine through, or are trapped in, deep states associated with point or structural defects such that the PL decays have little or no spectral dependence.

In contrast, FIG. 26 shows the room-temperature TRPL at the RS peak of the AlGaN alloy of the present invention, having localized Al inhomogeneities present therein, to be 290 meV below the band gap, which is strikingly different from its conventional BE counterpart. Since the reflectance data indicates no substantial absorption below the band edge in the AlGaN active region layer of the present invention, such that the pump pulse creates carriers primarily in the wider band gap AlGaN matrix, the slow rise time corresponds to the transfer of carriers from the surrounding matrix to localized states that participate more readily in radiative than in nonradiative processes through a combination of trap saturation and localization away from bulk defects due to carrier concentration in the nanoscale compositional inhomogeneities. The long PL lifetimes of the RS peak shown in FIG. 26, which are comparable to those observed in conventional materials with up to three orders of magnitude higher dislocation densities, provide further evidence of enhanced radiative efficiency associated with these nanoscale compositional inhomogeneities.

As the carrier density increases, saturation of the localized states causes the transient PL signal at the RS peak to achieve its maximum at earlier times, while the BE TRPL decays become slower due to the filling of both these localized states and the more conventional bandtail states in the wider band gap AlGaN matrix. A concomitant blue shift of the time-integrated PL at the RS peak with increasing pump intensity is also observed.

The present inventors unexpectedly discovered that a further enhancement of radiative efficiency is attained when using the UV LED of the present invention, through reduction of dislocation and point defect densities in both the higher Al content matrix and the localized regions of the material. In particular, the present inventors produced and tested a double heterojunction (DH) LED structure deposited by MBE on a 1.8 μm-thick $Al_{0.46}Ga_{0.54}N$ template grown by HVPE on sapphire.

This template has a dislocation density estimated in the mid-$10^9$ cm$^{-2}$ range. A 1 μm $Al_{0.42}Ga_{0.58}$N:Si (n~$5 \times 10^{18}$ cm$^{-3}$) current spreading layer was grown nearly lattice-matched atop the $Al_{0.46}Ga_{0.54}N$ template under conditions that inhibit localization. The active region layer consisted of a lightly doped 100 nm $Al_{0.3}Ga_{0.7}$N:Si (n~$1 \times 10^{17}$ cm$^{-3}$) layer exhibiting localization. The structure was capped with a 10 nm $Al_{0.42}Ga_{0.58}N$ electron blocking layer. The p-type current spreading layers were omitted for the optical studies.

Figure 27:
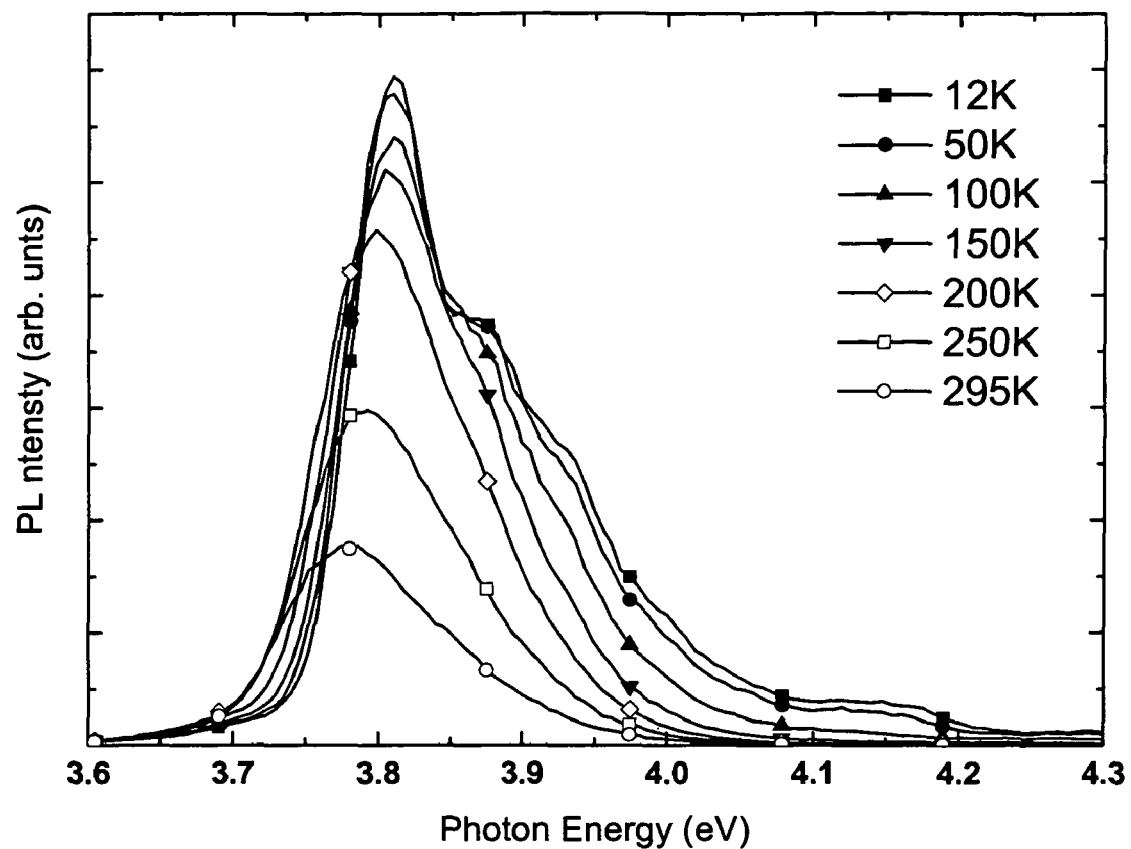
FIG. 27 is a graph illustrating the variable temperature photoluminescence versus photon energy for a UV light emitting sample device of the present invention deposited on an hydride vapor phase epitaxy grown AlGaN template

As illustrated in FIG. 27, the variable temperature PL for the above sample UV LED of the present invention was measured versus photon energy. The intensity of the PL from the localized states in the active region layer was found to only drop by a factor of 3.3 when the temperature was raised from 12 K to room temperature. This finding indicates significantly enhanced radiative efficiency of the UV LED of the present invention versus conventional devices (up to ~30% internal quantum efficiency), due to a combination of the NCI active region layer and reduction of defects in the sample device relative to structures grown on sapphire. This result is also reflected in the observation that the continuous wave (CW) PL from the above described DH LED structure is 3 to 4 times brighter at room temperature than that from the samples on sapphire. necessary to illustrate the invention.

The foregoing discussion discloses and describes embodiments of the invention by way of example. One skilled in the art will readily recognize from this discussion and from the accompanying drawings and claims, that various changes, modifications and variations can be made therein without departing from the spirit and scope of the invention as defined in the following claims and equivalents thereof.

What is claimed is:

1. A semiconductor-based ultraviolet light emitting device composition comprising:
   a group III-Nitride containing AlGaN alloy having self-assembled nanometer-scale localized compositionally inhomogeneous regions,
   wherein, when the alloy is optically or electrically injected or pumped, then luminescence occurs due to radiative recombination of carriers in the self-assembled nanometer-scale localized compositionally inhomogeneous regions having band-gap energies less than surrounding material
   and further wherein the self-assembled nanometer-scale localized compositionally inhomogeneous regions include a fine scale facetted surface morphology or pits with diameters of about 10 to 100 nanometers formed therein.

2. A semiconductor-based ultraviolet light emitting device comprising:
   a first semiconductor layer;
   a second semiconductor layer; and
   an active layer disposed between the first semiconductor layer and the second semiconductor layer, the active layer comprising a group III-Nitride alloy containing AlGaN having self-assembled nanometer-scale localized compositionally inhomogeneous regions having band-gap energies less than surrounding material,
   wherein, when the active layer is optically or electrically injected or pumped, ultraviolet light is emitted due to radiative recombination of carriers in the nanometer-scale inhomogeneous regions
   and further wherein the active layer has a fine scale facetted surface morphology or pits with diameters of about 10 to 100 nanometers formed therein.

3. The semiconductor-based ultraviolet light emitting device of claim 2, wherein the active layer has a thickness of about 50 nanometers or greater.

4. The semiconductor-based ultraviolet light emitting device of claim 2, wherein the active layer contains an AlN mole fraction of between about 20 to 80%.

5. The semiconductor-based ultraviolet light emitting device of claim 2, wherein the active layer is doped with an impurity.

6. The semiconductor-based ultraviolet light emitting device of claim 2, wherein the active layer is doped with an impurity selected from the group consisting of silicon, magnesium, beryllium, germanium and carbon.

7. The semiconductor-based ultraviolet light emitting device of claim 2, wherein the active layer is doped with an impurity selected from the group consisting of silicon, magnesium, beryllium, germanium and carbon, and wherein the concentration of the impurity is from $10^{14}$ to $10^{20}$ atoms/centimeter$^3$.

8. The semiconductor-based ultraviolet light emitting device of claim 2 wherein:
   the first semiconductor layer is a III-Nitride semiconductor; and
   the second semiconductor layer is a III-Nitride semiconductor.

9. The semiconductor-based ultraviolet light emitting device of claim 8, wherein the active layer has a thickness of about 50 nanometers or greater.

10. The semiconductor-based ultraviolet light emitting device of claim 8, wherein the active layer contains an AlN mole fraction of between about 20 to 80%.

11. The semiconductor-based ultraviolet light emitting device of claim 8, wherein the active layer has a fine scale facetted surface morphology with diameters of about 10 to 100 nanometers formed therein.

12. The semiconductor-based ultraviolet light emitting device of claim 2 wherein:
   the first semiconductor layer is an n-type semiconductor layer; and
   the second semiconductor layer is a p-type semiconductor layer.

13. The semiconductor-based ultraviolet light emitting device of claim 12, wherein the active layer has a thickness of about 50 nanometers or greater.

14. The semiconductor-based ultraviolet light emitting device of claim 12, wherein the active layer contains an AlN mole fraction of between about 20 to 80%.

15. The semiconductor-based ultraviolet light emitting device of claim 12, wherein the active layer has a fine scale facetted surface morphology with diameters of about 10 to 100 nanometers formed therein.

16. The semiconductor-based ultraviolet light emitting device of claim 12, wherein the active layer is doped with an impurity.

17. The semiconductor-based ultraviolet light emitting device of claim 12, wherein the active layer is doped with an impurity selected from the group consisting of silicon, magnesium, beryllium, germanium and carbon.

18. The semiconductor-based ultraviolet light emitting device of claim 12, wherein the active layer is doped with an impurity selected from the group consisting of silicon, magnesium, beryllium, germanium and carbon, and wherein the concentration of the impurity is from $10^{14}$ to $10^{20}$ atoms/centimeter.

19. The semiconductor-based ultraviolet light emitting device of claim 12, further comprising:
    a substrate,
    an AlGaN containing electron blocking layer, and
    a p-GaN layer.

20. The semiconductor-based ultraviolet light emitting device of claim 19, wherein the substrate is selected from the group consisting of a c-plane sapphire substrate, a group III-V nitride substrate or template on a sapphire substrate, a SiC semiconductor substrate, a GaAs semiconductor substrate, an InP semiconductor substrate, a ZnO semiconductor substrate, an elemental Si semiconductor substrate, an elemental Ge substrate, or any other substrate upon which a single crystal III-Nitride film may be grown.

21. The semiconductor-based ultraviolet light emitting device of claim 2, wherein the active layer comprises a plurality of alternating layers of AlGaN alloy containing different AlN mole fractions and having nanometer-scale localized compositionally inhomogeneous regions therein.

22. The semiconductor-based ultraviolet light emitting device of claim 2, wherein said active layer comprises a plurality of alternating layers of AlGaN alloy containing different AlN mole fractions and having nanometer-scale localized compositionally inhomogeneous regions therein, and wherein the plurality of alternating layers have thicknesses differing from each other.

23. The semiconductor-based ultraviolet light emitting device of claim 2, wherein the peak energy of the ultraviolet light emitted by the active layer is lower than the band gap energy of the active layer by not less than about 200 meV.

24. The semiconductor-based ultraviolet light emitting device of clam 2, wherein the active layer has an AlN mole fraction that is less than the AlN mole fraction of the first semiconductor layer and the AlN mole fraction of the second semiconductor layer.

25. A semiconductor-based ultraviolet light emitting device composition comprising:
    a group III-Nitride containing AlGaN alloy having nanometer-scale localized compositionally inhomogeneous regions,
    wherein the nanometer-scale localized compositionally inhomogeneous regions have a fine scale facetted surface morphology having pits with diameters of about 10 to 100 nanometers formed therein
    and further wherein, when the alloy is optically or electrically injected or pumped, they luminescence occurs due to radiative recombination of carriers in the nanometer-scale localized compositionally inhomogeneous regions having band-gap energies less than surrounding material.

26. A semiconductor-based ultraviolet light emitting device comprising:
    a first semiconductor layer;
    a second semiconductor layer; and
    an active layer disposed between the first semiconductor layer and the second semiconductor layer, the active layer comprising a group III-Nitride alloy containing AlGaN having nanometer-scale localized compositionally inhomogeneous regions having band-gap energies less than surrounding material and also having a fine scale facetted surface morphology having pits with diameters of about 10 to 100 nanometers formed therein,
    wherein, when the active layer is optically or electrically injected or pumped, ultraviolet light is emitted due to radiative recombination of carriers in the nanometer-scale inhomogeneous regions.

* * * * *